(12) United States Patent
Taniguchi et al.

(10) Patent No.: US 8,865,049 B2
(45) Date of Patent: Oct. 21, 2014

(54) METHOD FOR PRODUCING TRANSFER STRUCTURE AND MATRIX FOR USE THEREIN

(75) Inventors: Jun Taniguchi, Ibaraki (JP); Norio Yoshino, Tokyo (JP)

(73) Assignee: Tokyo University of Science Educational Foundation Administrative Org., Tokyo (JP)

( * ) Notice: Subject to any disclaimer, the term of this patent is extended or adjusted under 35 U.S.C. 154(b) by 826 days.

(21) Appl. No.: 13/060,692
(22) PCT Filed: Sep. 7, 2009
(86) PCT No.: PCT/JP2009/065612
§ 371 (c)(1),
(2), (4) Date: Feb. 25, 2011
(87) PCT Pub. No.: WO2010/027076
PCT Pub. Date: Mar. 11, 2010

(65) Prior Publication Data
US 2011/0159245 A1 Jun. 30, 2011

(30) Foreign Application Priority Data

Sep. 5, 2008 (JP) ................................. 2008-228937
Sep. 7, 2009 (JP) ................................. 2009-206479

(51) Int. Cl.
*B28B 7/36* (2006.01)
*B29C 33/56* (2006.01)
(Continued)

(52) U.S. Cl.
CPC *B29C 33/56* (2013.01); *H05K 3/20* (2013.01); *B29C 37/0053* (2013.01); *B29C 33/424* (2013.01); *H05K 2203/1152* (2013.01); *H05K 2201/0239* (2013.01); *H05K 3/025* (2013.01); *H05K 2201/0373* (2013.01); *B29C 33/60* (2013.01)
USPC ........ 264/338; 428/172; 428/195.1; 428/210; 428/447

(58) Field of Classification Search
CPC .......... B29C 33/56; B29C 33/60; H05K 3/30; H05K 3/025
USPC ......... 264/2.5, 338; 428/172, 195.1, 210, 447
See application file for complete search history.

(56) References Cited

U.S. PATENT DOCUMENTS 3,565,978 A * 2/1971 Folger et al. .................... 64/1.34
3,671,007 A * 6/1972 Bailey et al. ................ 249/114.1
(Continued)

FOREIGN PATENT DOCUMENTS

JP H10-319222 12/1998
JP 2004-63694 A 2/2004
(Continued)

OTHER PUBLICATIONS

Machine translation of JP 2004-107274 acquired on Feb. 21, 2014.*
(Continued)

*Primary Examiner* — Gerard Higgins
(74) *Attorney, Agent, or Firm* — SOLARIS Intellectual Property Group, PLLC

(57) ABSTRACT

There are provided a method for producing a transfer structure, in which detachment between a transfer-receiving material and a matrix can be easily achieved without destroying the fine pattern, the transfer pattern of the matrix is satisfactorily transferred to the transfer-receiving material, and the durability of the matrix is maintained for a long time during repeated transfer; and a matrix for use in the method. A film of a silane coupling agent represented by the following formula (I) is formed on a surface of a matrix having a transfer pattern formed on the surface thereof, a transfer-receiving material is applied thereon to transfer the pattern on the surface of the matrix, and the transfer-receiving material is detached from the matrix to obtain a transfer structure formed of the transfer-receiving material. In formula (I), n represents an integer of 8, 10, 12 or 14; m represents an integer of 3 or 4; and X, Y and Z each independently represent a hydrolyzable group that is a methoxy group, an ethoxy group, a propoxy group, an isopropoxy group, or a halogen atom.

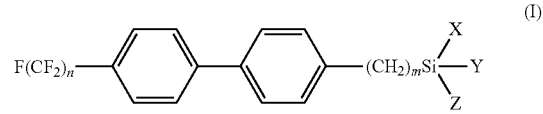

11 Claims, 19 Drawing Sheets

(51) Int. Cl.
  *H05K 3/20* (2006.01)
  *H05K 3/02* (2006.01)
  *B29C 33/60* (2006.01)
  *B29C 37/00* (2006.01)
  *B29C 33/42* (2006.01)

(56) References Cited

U.S. PATENT DOCUMENTS

| | | | |
|---|---|---|---|
| 5,204,126 A * | 4/1993 | Singh et al. | 425/412 |
| 7,150,844 B2 * | 12/2006 | Deeman et al. | 264/220 |
| 2008/0096366 A1 | 4/2008 | Aoki et al. | |
| 2008/0203271 A1 * | 8/2008 | Okinaka et al. | 249/114.1 |

FOREIGN PATENT DOCUMENTS

| | | |
|---|---|---|
| JP | 2004-107274 A | 4/2004 |
| JP | 2005-51095 A | 2/2005 |
| JP | 2007-238567 A | 9/2007 |
| JP | 2008-141167 A | 6/2008 |
| WO | WO 2008018570 A1 * | 2/2008 |

OTHER PUBLICATIONS

English language translation of the following: Office action dated Jul. 30, 2013 from the JPO in a Japanese patent application corresponding to the instant patent application. This office action translation is submitted now in order to supplement the understanding of patent document JPH10-319222 which is cited in the office action and is being disclosed in the instant Information Disclosure Statement.

* cited by examiner

FIG.9
(A)
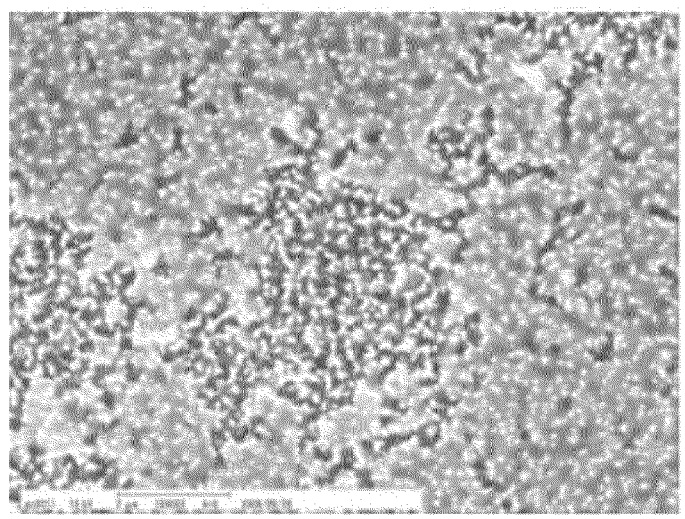
(B)
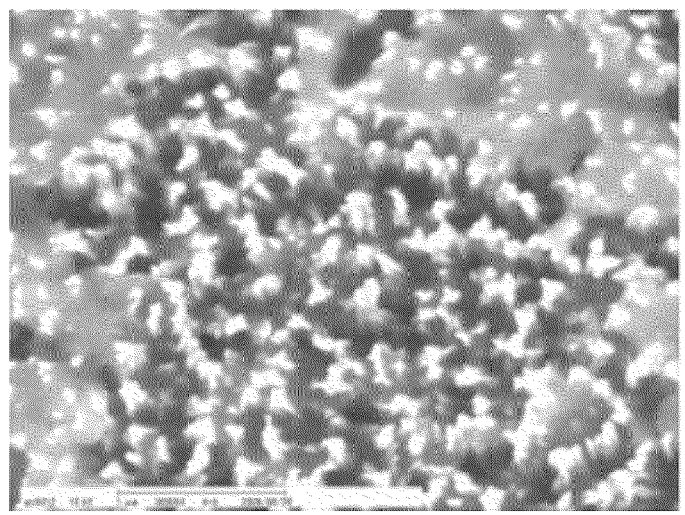
(C)
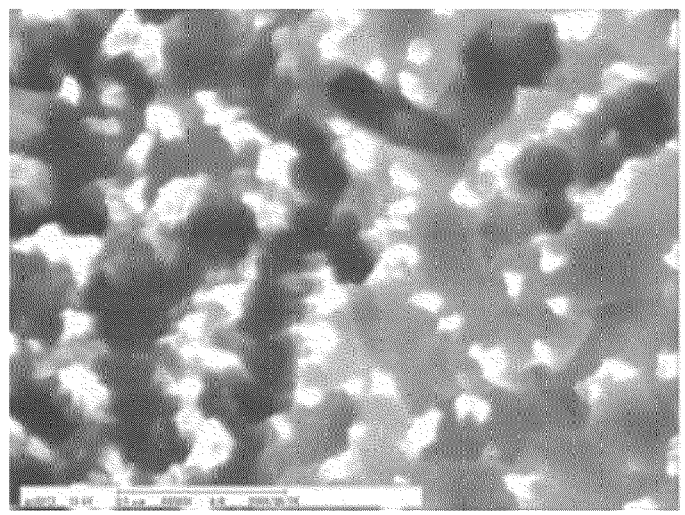

FIG.11
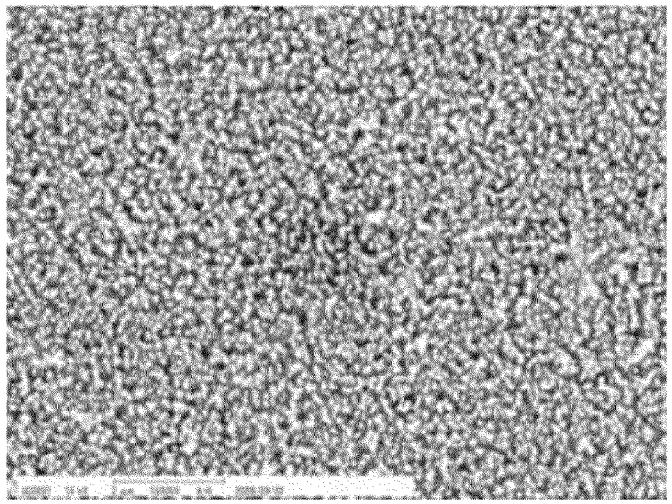
(A)
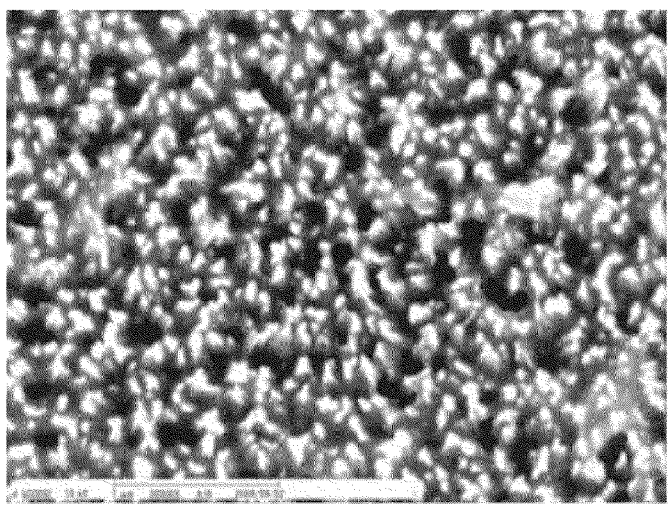
(B)
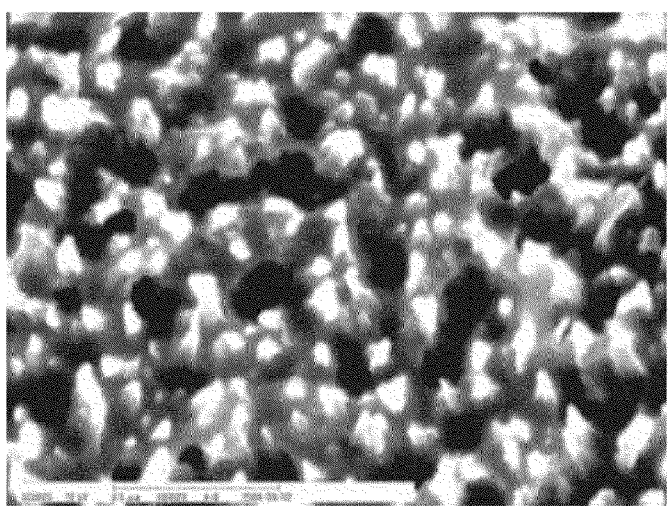
(C)

METHOD FOR PRODUCING TRANSFER STRUCTURE AND MATRIX FOR USE THEREIN

TECHNICAL FIELD

The present invention relates to a method for producing a transfer structure, and a matrix for use therein.

BACKGROUND ART

One type of method for forming a fine wiring pattern in the order of micrometers, or in the order of nanometers, on a substrate made of glass or a resin, is a method of performing transfer using a template (original plate) corresponding to the fine pattern to be formed.

For example, there is disclosed a method of forming an electroconductive film on a glass substrate, forming a predetermined pattern on the electroconductive film with a photoresist, subsequently forming a plating film on the areas where the electroconductive film is exposed, and affixing a base film to the plating film to transfer the plating film (see Japanese Patent Application Laid-Open (JP-A) No. 2004-63694).

DISCLOSURE OF INVENTION

Technical Problem

When a transfer pattern of a matrix has a height in the order of several micrometers or less, particularly in the order of nanometers, and includes fine concavities and convexities with a high aspect ratio densely formed therein, even if transfer is carried out by applying a releasing agent in advance on the transfer pattern surface of a matrix and affixing a transfer-receiving material, the transfer-receiving material and the matrix strongly adhere to each other so that they cannot be detached. If forcibly detached, there occurs a problem that the transfer pattern of the matrix is destroyed, and the transfer pattern cannot be used repeatedly.

Furthermore, achievement of mass production in the production of compact discs (CD) and the like is expected by using a roll-shaped nickel (Ni) stamper provided with a fine pattern, treating the surface with a releasing agent, and transferring the fine pattern to a roll-shaped transfer-receiving material (material sheet). However, it is currently the situation that no releasing agent, which is capable of maintaining the durability and service life corresponding to the length of the material sheet (for example, several kilometers) on the transfer-receiving side, is available.

It is an object of the invention to provide a method for producing a transfer structure, in which detachment between a transfer-receiving material and a matrix can be easily achieved without destroying the fine pattern such as described above, the transfer pattern of the matrix is satisfactorily transferred to the transfer-receiving material, and the durability of the matrix is maintained for a long time during repeated transfer; and a matrix for use in the method.

Solution to Problem

In order to achieve the above objects, the following invention is provided.

<1> A method for producing a transfer structure, the method comprising:
a step of forming a film of a silane coupling agent having a biphenylalkyl chain represented by the following formula (I), on a surface of a matrix having a transfer pattern formed on the surface thereof;

a step of applying a transfer-receiving material on the surface of the matrix having the film of the silane coupling agent formed thereon, thereby transferring the pattern on the surface of the matrix; and a step of detaching the transfer-receiving material from the matrix to obtain a transfer structure formed of the transfer-receiving material:

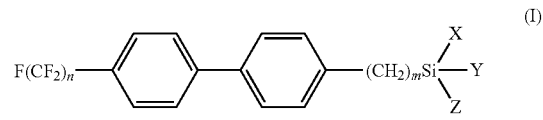

(I)

wherein in formula (I), n represents an integer of 8, 10, 12 or 14; m represents an integer of 3 or 4; and X, Y and Z each independently represent a hydrolyzable group that is a methoxy group, an ethoxy group, a propoxy group, an isopropoxy group, or a halogen atom.

<2> The method for producing a transfer structure according to <1>, wherein in formula (I), n is 10, 12 or 14.

<3> The method for producing a transfer structure according to <1> or <2>, wherein in formula (I), X, Y and Z are all identical.

<4> The method for producing a transfer structure according to any one of <1> to <3>, wherein in formula (I), m is 3, and X, Y and Z are all methoxy groups.

<5> The method for producing a transfer structure according to any one of <1> to <4>, further comprising a step of preparing the matrix having the transfer pattern formed on the surface thereof, as a preceding step of the step of forming the film of the silane coupling agent.

<6> The method for producing a transfer structure according to any one of <1> to <5>, wherein in the step of forming the film of the silane coupling agent, a liquid containing the silane coupling agent is applied on the surface of the matrix having the transfer pattern formed thereon, a heating treatment is subsequently carried out, and before or after the heating treatment, the surface of the matrix on which the liquid containing the silane coupling agent has been applied is rinsed.

<7> The method for producing a transfer structure according to any one of <1> to <6>, wherein the transfer pattern formed on the surface of the matrix is a pattern containing a group of fine protrusions each having a height of less than 1 µm and an aspect ratio of 2 or greater.

<8> The method for producing a transfer structure according to any one of <1> to <7>, wherein the matrix is formed from a base material of glassy carbon, and the transfer pattern, which includes a group of fine protrusions each having a shape that tapers toward a tip thereof, is formed on the surface of the base material.

<9> A transfer structure produced according to the method according to any one of <1> to <8>.

<10> A matrix having a transfer pattern formed on a surface thereof, and having a film of a silane coupling agent having a biphenylalkyl chain represented by the following formula (I), formed on the surface where the transfer pattern is formed:

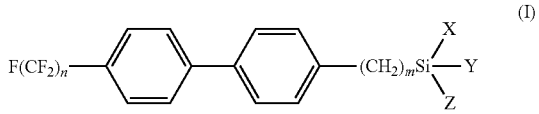

$$(I)$$

wherein n represents an integer of 8, 10, 12 or 14; m represents an integer of 3 or 4; and X, Y and Z each independently represent a hydrolyzable group that is a methoxy group, an ethoxy group, a propoxy group, an isopropoxy group or a halogen atom.

<11> The matrix according to <10>, wherein in formula (I), m is 3, and X, Y and Z are all methoxy groups.

<12> The matrix according to <10> or <11>, wherein the transfer pattern formed on the surface of the matrix is a pattern containing a group of fine protrusions each having a height of less than 1 μm and an aspect ratio of 2 or greater.

Advantageous Effects of Invention

According to the invention, there are provided a method for producing a transfer structure, in which detachment between a transfer-receiving material and a matrix can be easily achieved without destroying the fine transfer pattern formed on the matrix, the transfer pattern of the matrix is satisfactorily transferred to the transfer-receiving material, and the durability of the matrix is maintained for a long time during repeated transfer; and a matrix for use in the method.

BRIEF DESCRIPTION OF DRAWINGS

FIG. 9 is a set of SEM images obtained by observing the transfer pattern surface of the glassy carbon matrix after transfer in Example 1; (A) Magnification of 10,000 times, (B) Magnification of 30,000 times, and (C) Magnification of 60,000 times.

FIG. 11 is a set of SEM images obtained by observing the transfer pattern surface of the glassy carbon matrix after transfer in Example 2; (A) Magnification of 10,000 times, (B) Magnification of 30,000 times, and (C) Magnification of 60,000 times.

BEST MODE FOR CARRYING OUT THE INVENTION

Figure 1:
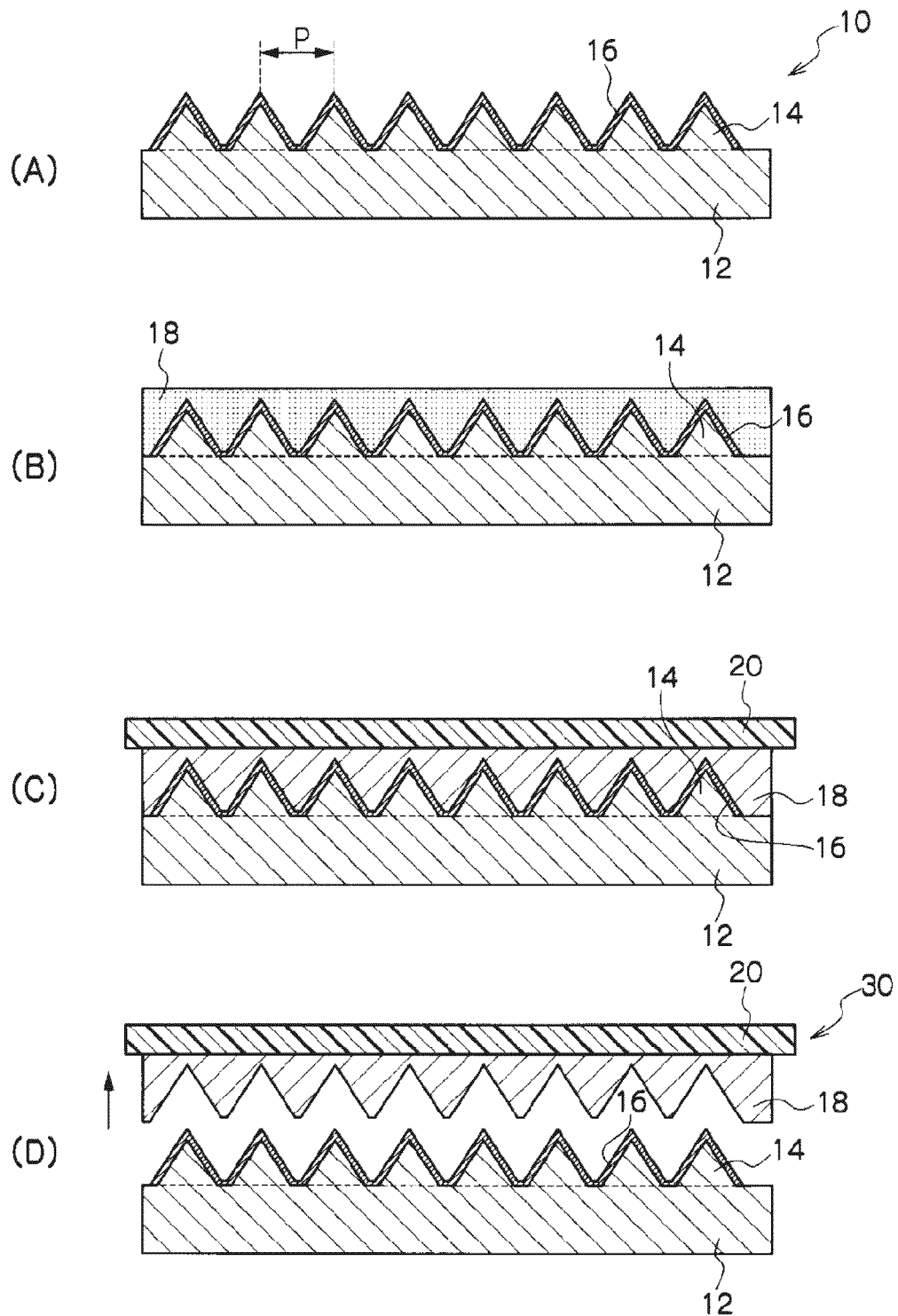
FIG. 1 is a diagram showing an example of the process for producing a transfer structure according to the invention.

Hereinafter, the invention will be specifically explained with reference to the attached drawings.

The inventors of the present invention first developed a structure having a base material made of glassy carbon, on which a fine pattern having a reflection ratio of 1% or less and containing a group of fine protrusions having a shape that tapers from the base toward the tip, such as a needle shape, a cone shape or a pyramid shape, is formed by subjecting the base material to ion beam processing using ECR (electron cyclotron resonance), and previously filed patent applications (see JP-A No. 2008-233850 and WO 2008/018570 A1). Furthermore, the inventors conducted further research on the technology of transferring a fine structure, for the purpose of imparting a satisfactory reflection preventing effect by using the structure having a fine pattern formed thereon, as a matrix, and transferring a fine pattern to another general-purpose transfer-receiving material such as a resin or a metal.

However, if the transfer pattern of the matrix is a pattern in which fine concavities and convexities having a height in the order of nanometers, such as less than 1 μm, and an aspect ratio of 2 or greater, are densely formed (appropriately referred to as "fine transfer pattern" or "fine pattern"), the transfer-receiving material and the matrix strongly adhere to each other and cannot be detached. If they are forcibly detached, there occurs a problem that the transfer pattern of the matrix is destroyed, and the transfer pattern cannot be used repeatedly. This problem cannot be solved, for example, even if commercially available products that are known as general releasing agents, such as Optool (manufactured by Daikin Industries, Ltd.) and Durasurf 1101Z (manufactured by Harves Co., Ltd.) are used.

On the other hand, the inventors of the present invention invented a novel silane coupling agent represented by the following formula (1), which can be used as a releasing agent, and previously filed patent applications (Japanese Patent Application No. 2007-055975, and PCT/JP2008/054074). The inventors further conducted research, and found that when the silane coupling agent is used as a releasing agent in a transfer using a matrix having a fine transfer pattern with a high aspect ratio, such as in the case of the glassy carbon substrate described above, detachment of the transfer-receiving material and the matrix can be easily carried out without destroying the transfer pattern, and furthermore, the transfer pattern of the matrix is satisfactorily transferred to the transfer-receiving material.

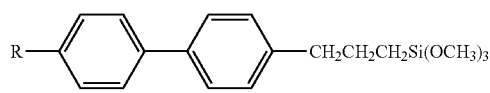

(1)

wherein in formula (1), R represents a perfluoroalkyl chain of $F(CF_2)_n$; and n represents an integer from 1 to 14.

Furthermore, the inventors further verified the usefulness of the novel releasing agent represented by the above formula (1) in a transfer using a matrix formed of glassy carbon such as described above, which has a fine transfer pattern with a high aspect ratio. The inventors found that the fine pattern transfer effect such as described above is not obtained sufficiently with a compound in which n is 7 or less, but in the case where n in the above formula (1) is 8 or greater, irrespective of the presence of a methoxy group, when a silane coupling agent represented by the following formula (I) is used, the transfer-receiving material and the matrix are easily detached without destroying the fine transfer pattern so that the transfer pattern of the matrix can be satisfactorily transferred to the transfer-receiving material, and further durability of the matrix is maintained over a long time period in repeated transfers, and a transfer structure having the fine pattern of the matrix can be produced.

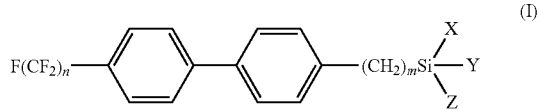

(I)

wherein in formula (I), n represents an integer of 8, 10, 12 or 14; m represents an integer of 3 or 4; and X, Y and Z each independently represent a hydrolysable group that is a methoxy group, an ethoxy group, a propoxy group, an isopropoxy group or a halogen atom. It is preferable that X, Y and Z be all identical. Furthermore, X, Y and Z are each preferably a methoxy group or a chlorine atom in view of having high reactivity with the base material of the matrix, and particularly preferably a chlorine atom in view of the reactivity to the substrate surface, except for the risk of the generation of hydrochloric acid at the time of surface reaction.

Figure 12:
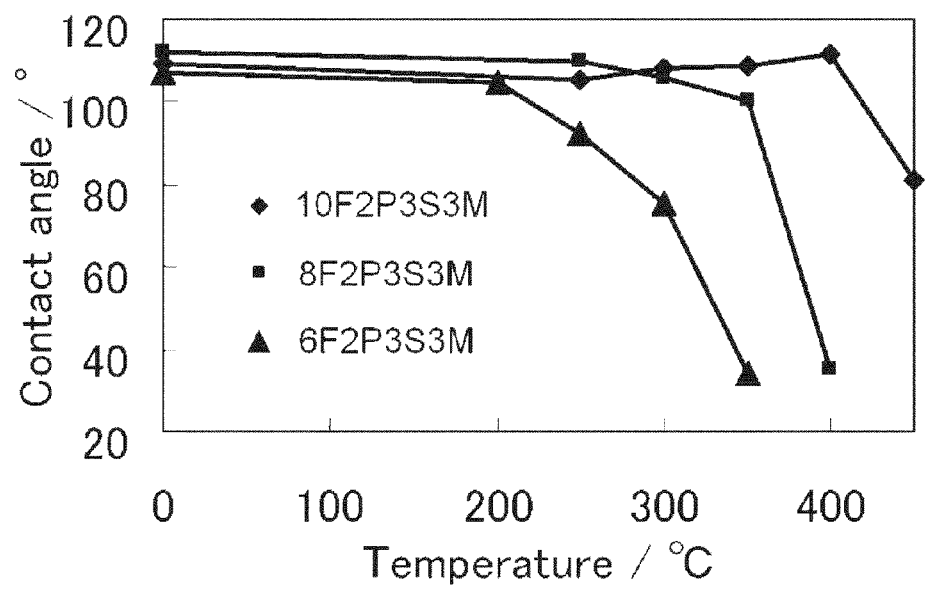
FIG. 12 is a graph showing the relationship between the heating temperature and the contact angle of various silane coupling agents.

FIG. 12 shows the relationship between temperature and contact angle verified by the present inventors with regard to compounds of formula (I), in which X, Y and Z are all methoxy groups, and the perfluoroalkyl chain ($F(CF_2)_n$) is $F(CF_2)_{10}$ (10F2P3S3M), $F(CF_2)_8$ (8F2P3S3M), or $F(CF_2)_6$ (6F2P3S3M). The heating time at various temperatures is 120 minutes. In the present specification, when a compound represented by the above formula (I) is indicated as, for example, "10F2P3S3M", this represents a compound in which the term "10F" means that n in $F(CF_2)_n$ is 10; the term "2P" means a biphenylene group; the term "3S" means that m in $(CH_2)_m$Si is 3; and the term "3M" means three methoxy groups, that is, X, Y and Z are all methoxy groups.

As can be seen from FIG. 12, according to the verification results of the present inventors, a compound in which n in the above formula (I) is 6, shows a contact angle of about 100 degrees at 200° C., but shows a drastically decreasing contact angle at temperatures higher than that, with insufficient heat resistance. Furthermore, a compound in which n is 4 or less, has an even lower contact angle and heat resistance. Therefore, it was confirmed that a compound in which n is 6 or less, is unsatisfactory to be applied in the transfer of fine patterns in the case of having processes operated at high temperature.

On the other hand, a silane coupling agent in which n in the above formula (I) is 8 or greater, has low surface energy, shows a contact angle of 100 degrees or greater with respect to water, and has heat resistance of about 300° C. or higher. Thus, the silane coupling agent is useful in the transfer of fine patterns such as described above. Particularly, a silane coupling agent in which n in the above formula (I) is 10 or greater, has very high heat resistance even at a temperature as high as about 400° C. Accordingly, when use is made of a silane coupling agent in which n shown in the above formula (I) is 8 or greater, and particularly n is 10 or greater, transfer can be achieved in a high temperature environment in a manner such that a metal film is formed, for example, by deposition that is generally performed at high temperature, on a film of the silane coupling agent (releasing agent layer) formed on the surface of a matrix having a fine pattern to be transferred, or a thermosetting resin is applied and then thermally cured thereon, the film is detached, and then this metal film or resin film serves as a transfer-receiving material to have the pattern transferred thereon.

The reason why the silane coupling agent used in the invention is very effective in the transfer of fine patterns is still theoretically unclear, but the reason is speculated to be as follows.

In the transfer of a fine pattern, when the space between fine protrusions is filled up with a releasing agent, it is impossible to carry out subsequent transfer. Therefore, it is thought indispensable to form a releasing agent layer which is thin as much as possible but has same thickness as much as possible on the transfer pattern. It is speculated that the silane coupling agent used in the invention can easily form a monolayer having a thickness of about 0.25 nm on the base material constituting the matrix (surface of the fine pattern of the matrix). Therefore, the silane coupling agent satisfies the conditions described above, has small surface free energy, and thus has high releasability, and is thermally stable, and is less susceptible to destruction under various physical stimulations. Thus, the silane coupling agent is believed to be effective in the transfer of fine patterns.

Furthermore, since the silane coupling agent used in the invention has a water-repellent and oil-repellent fluorine chain, the silane coupling agent has high water resistance, and forms stable bonding with the base material of the matrix. Moreover, due to the interaction of the biphenyl ring in addition to the siloxane bonding, the silane molecules approach and bind to each other, making the film of the silane coupling agent even denser. Accordingly, the $CF_3$ at the outermost surface are present at a high density, and this is speculated to be a factor causing high performance as a releasing agent.

FIG. 1 is a diagram showing an example of the process of the method for producing a transfer structure related to the invention.

The method for producing a transfer structure according to the invention includes:

a step of forming a film of a silane coupling agent having a perfluorobiphenylalkyl chain represented by the following formula (I), on the surface of a matrix having a fine transfer pattern formed on the surface;

a step of applying a transfer-receiving material on the surface of the matrix on which the film of the silane coupling agent has been formed, thereby transferring the pattern on the surface of the matrix; and a step of detaching the transfer-receiving material from the matrix to obtain a transfer structure formed of the transfer-receiving material.

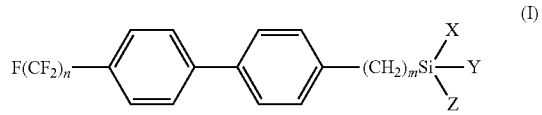

wherein in formula (I), n represents an integer of 8, 10, 12 or 14; m represents an integer of 3 or 4; and X, Y and Z each independently represent a hydrolyzable group that is a methoxy group, an ethoxy group, a propoxy group, an isopropoxy group, or a halogen atom.

In the step of forming a film of the silane coupling agent, a liquid containing the silane coupling agent may be applied on the surface of the matrix on which a transfer pattern is formed, and then a heating treatment may be performed, or a heating treatment may be omitted. Furthermore, if necessary, it is preferable to perform rinsing before or after the heating treatment.

The purpose of performing a heating treatment is to promote siloxane bonding and the bonding of the silane coupling agent to the base material surface, and to bring the fluorine chains in a stable state. To explain this by taking an example of the case in which X, Y and Z in formula (I) are all methoxy groups, when a silane coupling agent is applied on the base material surface in air, methoxy groups are converted to OH groups under the action of moisture in air, while methanol is released. When a methoxy group is converted to an OH group, the OH group reacts with a methoxy group of another molecule to form a siloxane bond. Furthermore, the OH group reacts with an OH group or adsorption water of the base material surface, and produces relatively weak bonding due to hydrogen bonding. As these various bondings thus formed are subjected to thermal aging, condensation between OH groups is promoted, the bonding of Si—O—Si or Si—O-base material is converted to strong covalent bonding, and thereby strong bonding is formed at the surface. These objects can be achieved, even without performing a heating treatment, simply by leaving the system to stand for a certain time after application.

It is thought that when siloxane bonding is completed, the distance between molecules is decreased, and the base material surface is densely covered with the fluorine-type silane coupling agent, so that the effect of enhancing releasability is exhibited.

The main purpose of the heating treatment performed after the releasing agent is applied, is to convert hydrogen bonding to covalent bonding, and to remove water or methanol. In the case of a general releasing agent, a heating treatment is carried out at 130° to 150° C. However, according to the experiments carried out by the present inventors, in the case of the silane coupling agent represented by formula (I), when a heating treatment is carried out at preferably 130° C. or lower, and more preferably at 80° C. to 100° C., or when no heating treatment is carried out, a decrease in detachability is suppressed despite an increase in the number of transfers.

Meanwhile, the purpose of performing rinsing is to wash away any unnecessary silane coupling agent molecules which are merely physically adsorbed on the outer side of the silane coupling agent molecules that are strongly bonded to the base material surface by covalent bonding, have scattered bonding directions so that fluorine chains do not necessarily face toward the air, and obstruct a decrease in the surface free energy.

An organic solvent, water and the like can be used as the rinsing liquid, and for example, fluorine-type solvents such as HFE-7100 (manufactured by Sumitomo 3M, Ltd.) can be used. After rinsing with a fluorine solvent, the coupling effect can be enhanced by further rinsing the surface with water to convert methoxy groups to OH groups.

<Matrix>

A matrix 10 having a transfer pattern formed on the surface is prepared. There are no particular limitations on the material, shape, size, and transfer (concavo-convex) pattern of the base material 12 which constitutes the main body of the matrix 10, and these parameters may be selected in accordance with the material to be transferred, the use, and the like.

Examples of the material (mold material) of the base material 12 include glassy carbon, silicon, SOG, quartz, ceramics, and metals such as nickel, particularly a nickel plate produced by plating, and tantalum, from the viewpoints of the formability of the pattern 14, mechanical strength and heat resistance as the matrix, and film formability of metal films.

Furthermore, the shape of the base material is usually a flat plate shape in the form of sheet, but a roll-shaped base material can also be used. A base material having a thin film flat plate shape, on which a fine pattern has been provided, can be wound on a roll and used in a roll-to-roll transfer system.

The concavo-convex pattern 14 on the surface of the base material 12 may be formed according to the purpose, and a desired concavo-convex pattern 14 may be formed on the surface of the base material 12 by, for example, lithography, electron beam processing, or ion beam processing.

For example, on the surface (one side) of the base material 12 such as a silicon substrate, a desired wiring pattern can be formed by lithography (photolithography, electron beam lithography, or the like) and etching. Alternatively, a predetermined concavo-convex pattern can be formed after calcining SOG (spin on glass) on a flat substrate such as a silicon substrate.

Furthermore, in the case of imparting a reflection preventing effect to the transfer-receiving material 18 or enlarging the surface area of the transfer-receiving material 18 by forming a group of fine protrusions in the order of nanometers on the surface of a base material 12, for example, a base material 12 such as glassy carbon is used, this is subjected to ion beam processing, and thereby a group of fine protrusions in the order of nanometers may be formed on the surface (processed surface) of the base material 12. For example, when a glassy carbon base material is subjected to ion beam processing by ECR (electron cyclotron resonance), a pattern including a group of fine protrusions having a shape that tapers from the base toward the tip, such as a needle shape, a cone shape or a pyramid shape, and having a height of less than 1 μm and an aspect ratio of 2 or greater, can be formed. Such a transfer pattern including a group of fine protrusions having a shape that tapers from the base toward the tip, is advantageous in that transfer (detachment) is made easy, as compared with a transfer pattern including a group of protrusions having an almost constant diameter, such as a cylinder shape. In the processing of ECR, the height or pitch P of the protrusions formed on the surface of the base material can be controlled to a certain extent, by regulating the processing time, accelerating voltage, and gas flow rate (see JP-A No. 2008-233850).

Figure 2:
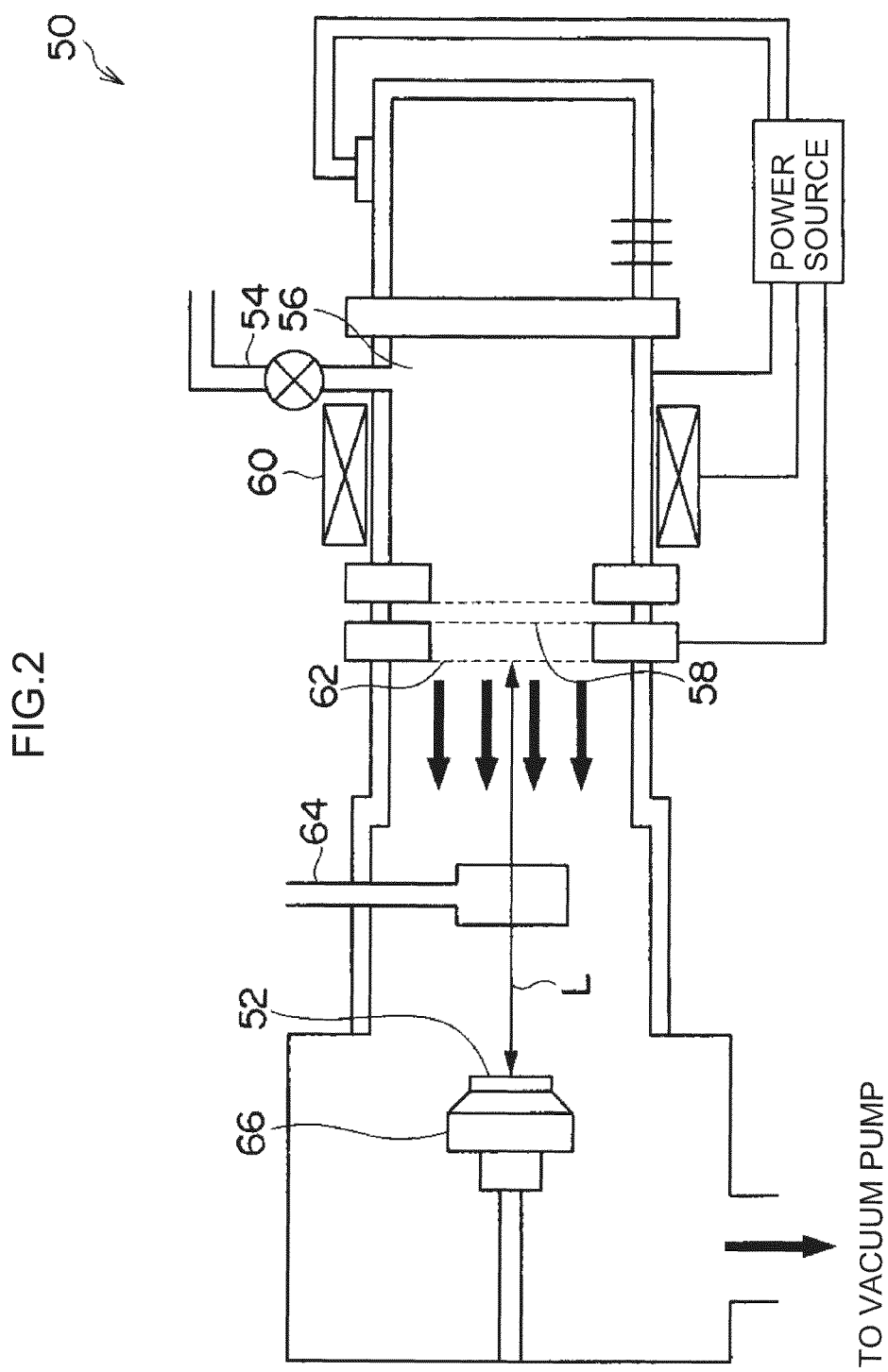
FIG. 2 is a schematic configuration diagram showing an example of the ECR type ion beam processing apparatus used in the production of a matrix having a transfer pattern.

FIG. 2 schematically shows an example of the configuration of an ECR (electron cyclotron resonance) type ion beam processing apparatus (plasma etching apparatus) that can be used in the production of a matrix according to the invention. This ion beam processing apparatus 50 includes a holder 66 for holding a substrate 52, a gas inlet tube 54, a plasma generating chamber 56, an extractor 58, an electromagnet 60, an ion beam extracting electrode 62, a Faraday cup 64, and the like. For example, since the current density decreases at a low accelerating voltage of 500 V or less, the extractor 58 is a grid for extracting ions at the plasma side from the extracting electrode 62, in order to increase the current density. When the extractor 58 is used, even if the accelerating voltage is low, the current density is increased, and the speed of processing can be increased.

In order to produce a matrix using such an ECR type ion beam processing apparatus 50, first, a base material 52 formed from glassy carbon as a raw material is prepared, and this base material is mounted on the holder 66. The glassy carbon base material that is used may have a plate shape, or may have a curved surface as the surface which is subjected to ion beam processing. It is preferable that the surface which is subjected to ion beam processing, has been polished. When a polished surface is used, the surface is smooth before etching, and fine protrusions can be uniformly formed thereon by processing.

After the glassy carbon base material is installed inside the apparatus 50, a reaction gas is introduced, and a predetermined accelerating voltage is applied, so that ion beam processing is performed on the surface of the base material 52.

As the reaction gas, a gas containing oxygen is used, and only oxygen may be used, or a gas mixture of oxygen and a CF-based gas such as $CF_4$ can also be used.

As such, ion beam processing is performed on the surface of the base material 52 by using an ECR type ion beam processing apparatus 50, whereby a group of fine protrusions (fine structure) having a shape that tapers toward the tip can be formed. The shape and pitch of the protrusions that are formed on the surface of the glassy carbon base material 52 are greatly affected by the accelerating voltage, processing time, and gas flow rate during the ion beam processing. Therefore, the shape and pitch of the protrusions that are formed on the surface of the base material can be controlled by controlling at least any one of the accelerating voltage, processing time, and gas flow rate. Furthermore, by regulating the accelerating voltage, processing time, gas flow rate and the like, for example, with regard to the shape of the protrusions, not only a group of fine protrusions having a needle shape but also a group of fine protrusions having a cone shape, a pyramid shape, a truncated cone shape, a truncated pyramid shape, a parabolic shape or the like can also be formed as the shape that tapers toward the tip.

When an ECR type ion beam processing apparatus 50 is used, processing can be carried out all at once even on a relatively large surface. Furthermore, according to such a method, a glassy carbon base material can be easily surface-processed, and a matrix which can exhibit a reflection preventing effect close to non-reflection, can be produced.

According to the study of the present inventors, particularly when a glassy carbon substrate is subjected to ECR processing by setting the accelerating voltage at 300 V or higher, and a processing time at 18 minutes or longer, needle-shaped or cone-shaped protrusions that taper from the base part to the tip part can be formed reliably, and a reflection ratio of 20% or less can be obtained. On the other hand, if an excessively high accelerating voltage is used, the protrusions become finer and are prone to folding at the time of transfer. If the processing time is extended, there is a risk of causing a decrease in productivity. Therefore, it is preferable to set the accelerating voltage to 1000 V or less, and the processing time to 30 minutes or less.

Furthermore, it is thought that in a glassy carbon base material, a surface having a group of fine protrusions having a shape that tapers toward the tip such as described above, makes the incident light difficult to be reflected and provides a higher reflection preventing effect, as compared with the case where pillar-shaped protrusions are formed.

It was found that when the fine protrusions 14 having a shape that tapers toward the tip, which are formed on the surface of the matrix 10 according to the invention, have an average height (H) of 200 nm to 3000 nm, and more preferably 720 nm to 1370 nm, have a base diameter for each protrusion 14, that is, an average maximum diameter, in the range of 50 nm to 300 nm, and more preferably 80 nm to 220 nm, and are formed at a pitch (P) of 50 nm to 300 nm, and more preferably 120 nm to 220 nm, the fine protrusions can exhibit a very high reflection preventing effect. Particularly, when the protrusions have a height of 200 nm or greater and are formed at a pitch of 140 nm or less, a non-reflective structure can be obtained.

The inventors of the present invention further conducted an investigation on the relationship between the angle of the tip part of the protrusion and the reflection ratio. In the case where protrusions 14 having a shape that tapers from the base part to the tip part, are formed at a predetermined pitch, when the angle of the tip part of the protrusion 14 (apex angle) is designated as $2\theta$, the radius (D/2) of the base part as r, and the height as h, since $\tan\theta = r/h$, the following relationship is established: $\theta = \tan^{-1}(r/h)$.

Furthermore, in order to have a non-reflective structure, theoretically, conditions in which the pitch (P) of a protrusion <137 nm, and height (h) >200 nm, are required. From these, a non-reflective structure is obtained when $2\theta < 37.8°$. Therefore, it is thought that when the angle of the tip part of the protrusions 14 satisfies the above relationship, non-reflection, or a reflection ratio close to non-reflection, can be achieved. However, if the angle of the protrusion tip part is too small, it is thought that the protrusions are susceptible to folding at the time of transfer, and the protrusions acquire a shape that is close to a pillar shape with a uniform diameter, so that the reflection ratio rises. Accordingly, when the protrusions 14 have a needle shape or a cone shape, the angle of the tip part is preferably 3° or greater, more preferably 10° or greater, and particularly preferably 15° or greater.

Such a matrix which has a group of fine protrusions having a shape that tapers toward the tip, such as a needle shape, on the surface of a base material of glassy carbon, acquires a transfer pattern having a reflection preventive structure close to non-reflection. Such a matrix produced from glassy carbon has very high heat resistance, and also has high mechanical strength unlike carbon materials such as graphite. Therefore, repeated transfer can be achieved not only to resin materials, but also to a member having a high melting point, such as one made of quartz glass or metal.

Furthermore, a matrix may also be produced by subjecting a processed surface of glassy carbon to plating or deposition with a metal such as nickel or gold. In a template produced as such, the concavo-convex pattern formed on the processed surface of glassy carbon is reflected. Therefore, when this matrix is used, a reflection preventive structure can be indirectly transferred to a member having a relatively low melting point (softening point), for example, a film formed of a resin material. Thus, a resin film having a reflection preventive function close to non-reflection, and the like can be produced.

Furthermore, the matrix according to the invention may have large-sized scattered protrusions which have a width and a height that are 5 times or more of the width and height of the fine protrusions constituting the reflection preventive structure on the surface of the glassy carbon base material, and which have a shape that tapers toward the tip. In order to form such large-sized protrusions, for example, ion beam processing may be carried out while mask materials for forming large-sized protrusions are located in a scattered manner on the surface of the glassy carbon base material. As a result, areas other than the masked areas are processed, and the masked areas remain as large protrusions. Examples of the mask materials that can be used include siloxane polymers, and masks can be located in a scattered manner at predetermined positions on a glassy carbon base material by photolithography or electron beam lithography.

When such a matrix having a reflection preventive structure pattern, in which large-sized protrusions are present in a scattered manner, together with fine protrusions having a needle shape or the like, on the surface of a glassy carbon base material, is used to perform transfer to, for example, an optical substrate made of quartz glass or the like, a surface structure having a group of fine protrusions in the order of nanometers as well as notches in the order of micrometers (referred to as microprism array, or the like), can be produced. When a glass material having such a surface structure is produced, an optical member having a higher reflection preventing effect can be obtained.

The invention has been discussed with the focus on the case of using glassy carbon as the material (mold material) of the base material 12, but the material is not limited to glassy carbon, and as described above, silicon, SOG, quartz, a ceramics, or a metal such as nickel, particularly nickel produced by plating, or tantalum, can also be used.

<Releasing Agent>

According to the invention, a silane coupling agent having a perfluorobiphenylalkyl chain represented by the following formula (I) (hereinafter, appropriately referred to as "silane coupling agent" or "releasing agent") is used as a releasing agent, to form a film 16 of the silane coupling agent on the surface of the matrix 10 where a transfer pattern 14 is formed (FIG. 1(A)).

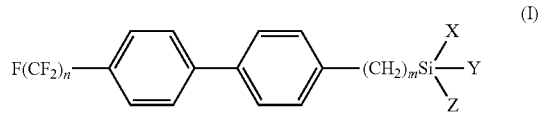

wherein in formula (I), n represents an integer of 8, 10, 12 or 14; m represents an integer of 3 or 4; and X, Y and Z each independently represent a hydrolysable group that is a methoxy group, an ethoxy group, a propoxy group, an isopropoxy group or a halogen atom.

The silane coupling agent has low surface energy, shows a contact angle of 100 degrees of greater with respect to water, and has heat resistance of about 300° C. or higher. Particularly, a silane coupling agent in which n is 10 or greater, can maintain the contact angle value even after being exposed to an atmosphere at 350° C. or higher for 4 hours or longer, or to an atmosphere at 400° C. for 10 hours. In other words, the silane coupling agent has excellent heat resistance to the extent that a surface modified with this silane coupling agent does not show a decrease in the contact angle, and the silane coupling agent is also excellent in durability, releasability, and anti-fouling properties.

The silane coupling agent represented by the above formula (I) can be produced by, for example, the following method.

4,4'-dibromobiphenyl represented by the following formula (2):

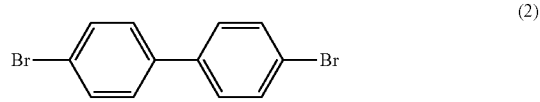 [SMILES: Brc1ccc(-c2ccc(Br)cc2)cc1]

is reacted with a perfluoroalkyl iodide represented by the following formula (3):

$$F(CF_2)_n I \quad (3)$$

wherein n is an integer from 8 to 14 in a polar solvent, using a copper bronze powdered catalyst, and thus a 4-perfluoroalkyl-4'-bromobiphenyl represented by the following formula (4) is synthesized:

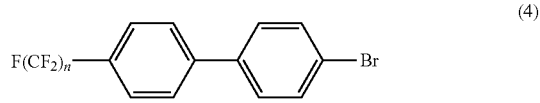

Next, the 4-perfluoroalkyl-4'-bromobiphenyl is reacted with an unsaturated alkyl bromide represented by the following formula (5):

$$CH_2=CH(CH_2)_p-Br \quad (5)$$

wherein p represents an integer from 1 to 4 in a polar solvent using a CuI catalyst, and thus a 4-perfluoroalkyl-4'-vinylalkylbiphenyl represented by the following formula (6) is synthesized.

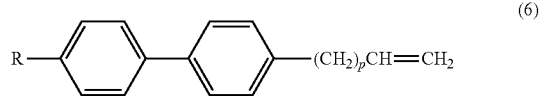

Subsequently, the 4-perfluoroalkyl-4'-vinylalkylbiphenyl is reacted with one compound selected from the silanes described below, in an organic solvent using a chloroplatinic acid catalyst, and thus the silane coupling agent represented by the above formula (I) can be produced.

Silanes: trimethoxysilane, triethoxysilane, tripropylsilane, triisopropylsilane, methyldimethoxysilane, methyldiethoxysilane, methyldipropoxysilane, methyldiisopropoxysilane, trichlorosilane, and methyldichlorosilane.

There are no particular limitations on the method of applying the silane coupling agent on the transfer pattern surface of the matrix, but in the case of a nano-sized fine pattern, if the film of the silane coupling agent applied is too thick, the pattern is embedded. On the other hand, if the silane coupling agent is insufficiently applied, there is a risk that the releasing agent may not be spread sufficiently to the bottom of the fine pattern (particularly, a pattern having a high aspect ratio). To prevent the occurrence of such problems, the method of application can be selected from known coating methods such as, for example, spray coating, spin coating, dipping, multicoating thereof, roll coating, screen printing, and deposition.

For example, in the case where the transfer pattern is a fine structure in the order of nanometers, in which the height of the protrusions (convex part) is less than 1 μm, and the aspect ratio is 2 or greater, when the transfer pattern is coated with a silane coupling agent, it is preferable to dissolve the silane coupling agent in a solvent and apply the solution by spin coating, in order to apply the silane coupling agent as uniformly as possible on the pattern surface and prevent destruction of the transfer pattern due to pressurization. In the case of a large-sized mold, dipping is preferred. Furthermore, in order to allow the silane coupling agent to reach the bottom of the mold, a convection flow or ultrasonic vibration can be applied.

The releasing agent layer may be formed over the entire surface of the pattern, or may also be formed on a portion of the pattern, for example, only on convex parts, depending on the size and density of the fine pattern, the use of the transferred pattern, the material of the non-transfer member, and the like.

Examples of the solvent that is used to dissolve the silane coupling agent include benzene, toluene, xylene, fluorine-type solvents (for example, HFE-7100 and HFE-7200 [$(CF_3)_2CFCF_2—O—CH_2CH_3$] manufactured by Sumitomo 3M, Ltd., fluoropolyether-based solvents, and substitute Freon), diethyl ether, tetrahydrofuran, and ethyl acetate. It is preferable to use the silane coupling agent in a solvent selected from among these, at a concentration of 0.01% to 10%, and more preferably 0.1% to 1.0%.

In regard to the film 16 of the silane coupling agent formed on the transfer pattern surface of the matrix 10, if the film thickness is too large, the releasing agent 16 is filled between the fine concavities and convexities of the pattern 14, and it is difficult for the transfer-receiving material 18 to be embedded deeply. As a result, there is a possibility that the transfer pattern of the matrix may not be sufficiently reflected on the transfer-receiving material 18. Accordingly, the thickness of the releasing agent film formed on the transfer pattern surface of the matrix is preferably a monolayer to 50 nm, and more preferably a monolayer to 10 nm.

The film thickness of the silane coupling agent can be regulated by, for example, adjusting the concentration of the silane coupling agent in the solution used to apply the silane coupling agent on the transfer pattern surface. Alternatively it is possible to produce a thin film by applying a solution containing the silane coupling agent on the transfer pattern surface, and then rinsing the transfer pattern surface with the solvent.

Subsequently, the matrix on which a film of the silane coupling agent has been formed, is optionally baked through a heating treatment. Furthermore, after the releasing agent has been applied on the transfer pattern surface of the matrix, it is preferable to rinse the releasing agent before or after the heating treatment. It is particularly preferable to perform rinsing after the heating treatment. The conditions for the heating treatment are not limited, and for example, the heating treatment may be carried out in an oven at 130° C. for 30 minutes, at 150° C. for 20 minutes to 30 minutes, or at 120° C. to 160° C. for 15 minutes to 35 minutes.

Because the silane coupling agent used in the invention has a perfluoroalkyl group and a biphenylalkyl group, the releasing agent film forms a monolayer (one layer of molecules), and through the heating treatment, a siloxane network is established in which siloxane bonding is formed in the form of a two-dimensional or three-dimensional network. Therefore, it is speculated that the silane coupling agent of the invention is effective in the transfer of fine patterns.

<Transfer>

A transfer-receiving material 18 is applied on the surface of the matrix 10 having the film 16 of the silane coupling agent formed thereon, whereby the pattern 14 on the surface of the matrix 10 is transferred (FIG. 1(B)).

There are no particular limitations on the material 18 used to transfer the transfer pattern of the matrix 10 (transfer-receiving material), and the material may be selected in accordance with the use after transfer, or the like. When the matrix 10 is constructed from glassy carbon, the matrix has very high heat resistance and has much higher mechanical strength than carbon materials such as graphite. Therefore, as the transfer-receiving material 18, for example, resin materials such as an ultraviolet-curable resin, a thermosetting resin, and a thermoplastic resin, as well as high-melting temperature materials such as quartz glass and metals can also be used.

The method of applying the transfer-receiving material 18 on the surface of the matrix 10 having the film 16 of the silane coupling agent formed thereon, is also not particularly limited and may be selected in accordance with the material of the transfer-receiving material 18 and the matrix 10, and the like. For example, in the case of using a resin material as the transfer-receiving material 18, known coating methods such as spray coating, spin coating, roll coating and screen printing are suitable. When the transfer-receiving material is an ultraviolet-curable resin or a thermosetting resin, the resin is applied by spin coating or the like on the transfer pattern surface where the film 16 of the silane coupling agent is formed, and then the resin may be cured by ultraviolet irradiation or heating. Furthermore, in the case of using a thermoplastic resin as the transfer-receiving material 18, for example, a film which has been formed in advance is pressed against the transfer pattern 14 of the matrix 10 and heated at the same time, whereby the concavo-convex pattern 14 of the matrix 10 is transferred to the softened resin. Subsequently, the resin may be cooled and hardened again.

On the other hand, in the case of using a metallic material as the transfer-receiving material 18, film formation by deposition or plating can be applied. Particularly, since the silane coupling agent used in the invention has high heat resistance, when a metal layer is formed as the transfer-receiving material 18 on the fine pattern 14 of the matrix 10 having the film 16 of the silane coupling agent formed thereon, for example, by vacuum deposition under the temperature of 200° C. or higher, subsequently a resin plate such as PET as a supporting member 20 is pressed against the metal layer and heated, and then the resin plate is detached, a resin plate provided thereon with a metal layer in the form of a fine pattern can be produced. For example, a wiring substrate can be produced thereby.

Furthermore, two metal layers formed of different metals (for example, Cr for a first metal layer, and Au for a second metal layer) are sequentially formed on the fine pattern 14 of the matrix 10, without using the silane coupling agent, subsequently a resin plate is pressed and heated thereon, the second metal layer that is the upper layer is detached, and thus a resin plate provided thereon with the second metal layer is produced. Furthermore, a silane coupling agent layer is formed on the fine pattern of the resin plate where the second metal layer in the form of a fine pattern is provided, and this resin plate is used as a mold to transfer this fine pattern to a photocurable resin. By performing this operation repeatedly, a member having a structure on which the fine pattern of the matrix 10 is reflected can be produced in large numbers.

In the case of using glass, for example, if the glass is SOG (Spin on Glass), it can be spin-coated and then calcined at a relatively low temperature (for example, 250° C. to 500° C.) to cure. The silane coupling agent used as a releasing agent in the invention has high heat resistance, and can maintain releasability even if calcined at the high temperature described above.

In order to make the transfer-receiving material 18 more easily detachable from the matrix 10, a supporting member 20 may be integrated with the transfer-receiving material 18 by affixing (FIG. 1(C)).

For example, after a resin solution is applied on the transfer pattern 14, the supporting member 20 is affixed thereon, and while optionally pressing the supporting member 20 against the matrix 10, the transfer-receiving material 18 is cured. When the transfer-receiving material 18 is integrated with the supporting member 20 in this manner, detachment from the matrix 10 can be more easily carried out by holding the supporting member 20.

There are no limitations on such a supporting member 20, as long as it can be affixed to the transfer-receiving material 18 and is capable of supporting the transfer-receiving material 18 when the transfer-receiving material is detached from the matrix 10, and the supporting member may be selected in accordance with the type of the transfer-receiving material 18, the use, and the like. For example, in the case of using a resin material as the transfer-receiving material 18, a substrate containing the same type of resin material can be suitably used.

For example, a wiring member can be produced by forming in advance the convex parts of the fine pattern in the form of a wiring pattern, depositing a metal layer on the convex parts, and then transferring the metal layer formed corresponding to the wiring pattern to the resin that serves as a supporting member 20. As such, a matrix in which a film of the silane coupling agent represented by the above formula (I) is formed in a fine pattern, can be advantageously used in a repeated production of a transfer structure such as a wiring member having a wiring pattern such as described above.

Furthermore, the surface of the supporting member 20 to be affixed to the transfer-receiving material 18 may be roughened, so as to enhance the adhesion strength to the transfer-receiving material 18. For example, when the surface of the supporting member 20 is roughened by a method of attaching fine particles to the surface of the supporting member 20, a method of blowing fine particles at a high pressure (blasting) or the like, concavities and convexities are formed on the surface, and thereby the adhesion strength to the transfer-receiving material 18 can be enhanced.

<Release>

After the transfer pattern 14 on the surface of the matrix 10 is transferred to the transfer-receiving material 18, the transfer-receiving material 18 is detached from the matrix 10 (FIG. 1(D)).

For example, when the transfer-receiving material 18 is integrated with the supporting member 20, it is possible to separate it from the matrix 10 while holding the supporting member 20. Thereby, a transfer structure 30 in which the transfer pattern 14 of the matrix 10 is reflected on the transfer-receiving material 18 with high accuracy, is obtained.

In the invention, since the silane coupling agent represented by formula (I) is used as a releasing agent, the transfer-receiving material 18 on which a concavo-convex pattern 14 of the matrix 10 has been transferred and which is cured (transfer-receiving member) can be easily detached from the matrix 10, and at the same time, destruction of the transfer pattern 14 of the matrix 10 can be effectively suppressed.

Moreover, the film 16 of the silane coupling agent is also dependent on the material of the matrix 10, but for example, in the case of using glassy carbon as the matrix 10, the film of the silane coupling agent remains strongly bonded to the transfer pattern surface even after detachment of the transfer-receiving material 18. Therefore, after the detachment, transfer to the transfer-receiving material 18 can be repeatedly carried out, without applying the silane coupling agent again. Accordingly, application of the present invention enables, for example, mass production of a resin film or a glass substrate having a reflection preventive function close to non-reflection, at low cost.

Furthermore, a large number of duplicates having a fine pattern can also be produced repeatedly by using a transfer structure which is produced using the matrix 10 having a fine pattern according to the invention, as a mold, and transferring the fine pattern again. For example, Cr and Au are sequentially deposited on a matrix 10 having a fine pattern 14 to form two kinds of metal layers, subsequently the Au film having a pattern form is transferred to a resin, the surface of the Au film on the resin having the transferred pattern is treated with the silane coupling agent represented by the above formula (I) or another releasing agent, and then the fine pattern of this Au film can be retransferred to a photocurable resin.

EXAMPLES

Hereinafter, the Examples will be described, but the invention is not limited to the following Examples.

—Surface Processing of Base Material—

A substrate (thickness: 1 mm, width and length: 10 mm×10 mm) of glassy carbon (manufactured by Tokai Carbon Co., Ltd.) having a polished surface was subjected to ion beam processing on the surface using an ECR (electron cyclotron resonance) type ion beam processing apparatus (trade name: EIS-200ER, manufactured by Elionix, Inc.) having a configuration as shown in FIG. 2.

This ion beam processing apparatus 50 includes a holder 66 for holding a substrate 52, a gas inlet tube 54, a plasma generating chamber 56, an extractor 58, an electromagnet 60, an ion beam extracting electrode 62, a Faraday cup 64, and the like. Since the current density decreases at, for example, a low accelerating voltage of 500 V or less, the extractor 58 is a grid for extracting ions at the plasma side from the extracting electrode 62 so as to increase the current density. When the extractor 58 is used, even if the accelerating voltage is low, the current density increases, and thereby the processing speed can be increased.

The glassy carbon substrate 52 was mounted on the holder 66, oxygen was introduced as a reaction gas, and a predetermined accelerating voltage was applied to thereby perform ion beam processing on the surface of the glassy carbon substrate 52. The processing conditions were as follows.

Beam irradiation angle: Perpendicular to the processed surface (90° with respect to the transfer pattern surface of the substrate)

Reaction gas: Oxygen

Gas flow rate: 3.0 SCCM

Microwave: 100 W

Accelerating voltage: 500 V

Processing time: 45 minutes

Degree of vacuum: $1.3 \times 10^{-2}$ Pa

Figure 3:
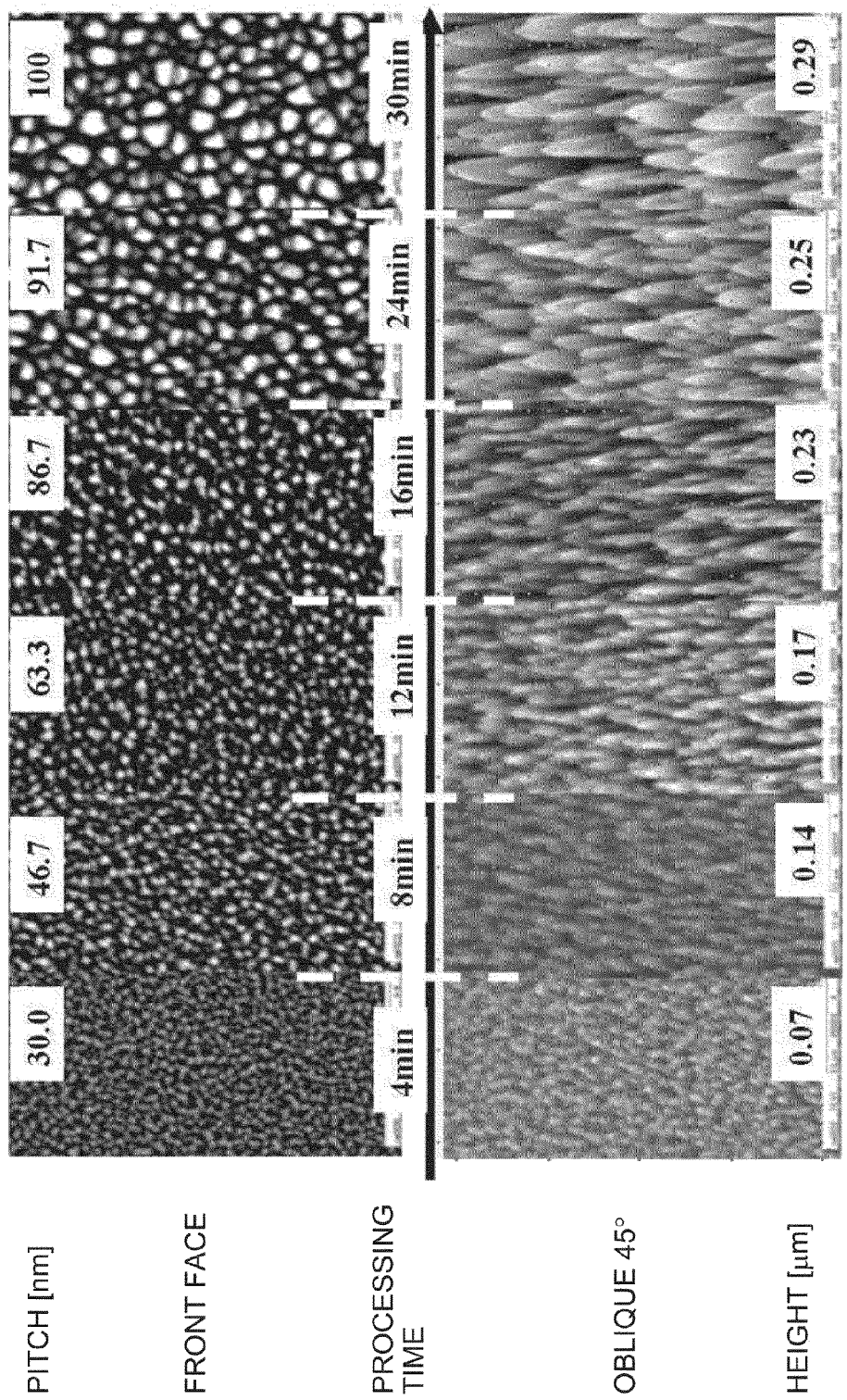
FIG. 3 is a set of SEM images obtained by observing the surface of a glassy carbon substrate processed by ECR while changing the processing time.

FIG. 3 is a set of SEM images showing the surface state of the glassy carbon substrate processed by changing the processing time. As can be seen in FIG. 3, a pattern composed of a group of fine protrusions having a shape that tapers toward the tip, is formed on the surface (processed surface) of the glassy carbon substrate, and the height and pitch of the protrusions are changed in accordance with the processing time.

—Preparation of Releasing Agent—

Compounds in which X, Y and Z in formula (I) are all methoxy groups, and (1) R is $F(CF_2)_8$ (8F2P3S3M), (2) $F(CF_2)_{10}$ (10F2P3S3M), and (3) $F(CF_2)_{12}$ (12F2P3S3M), were respectively synthesized by the following process.

(1) $F(CF_2)_8(C_6H_4)_2CH_2CH_2CH_2Si(OCH_3)_3$ [8F2P3S3M] was synthesized through the following steps (1-1) to (1-3).

(1-1) Synthesis of $F(CF_2)_8(C_6H_4)_2Br$ [8F2PB]

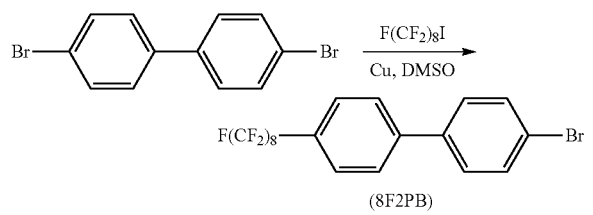

(8F2PB)

A 500-ml eggplant-shaped flask equipped with a reflux condenser and a dropping funnel was replaced with a nitrogen atmosphere, and 23.0 g (362 mmol) of copper bronze powder, 25.0 g (80.1 mmol) of 4,4'-dibromobiphenyl, and 120 ml of DMSO as a solvent were added to the flask. Subsequently, the mixture was heated and stirred at 120° C. After 2 hours, 23.6 ml (80.5 mmol) of perfluorooctyl iodide was slowly added dropwise thereto, and then the mixture was heated and stirred at 120° C. for 24 hours. After completion of reflux, the solution was cooled to room temperature, and excess copper powder and a white solid were separated by filtration using a Kiriyama funnel. A mixture of the copper powder and white solid thus obtained was subjected to Soxhlet extraction using ethyl acetate as a solvent. $CuBr_2$ and CuI present in the extract liquid were removed by washing with a saturated aqueous solution of NaCl, and the extract liquid was dehydrated over magnesium sulfate. Ethyl acetate was distilled off under reduced pressure. The residue was purified by distillation under reduced pressure, and thus a distillate was obtained.

The distillate thus obtained was analyzed respectively by $^1$H-NMR, FT-IR and mass spectrometry. The obtained distillate was identified as 8F2PB by $^1$H-NMR, FT-IR and mass spectrometry (m/z 651), respectively.

Yield amount 22.9 g (35.2 mmol)
Yield ratio 44%
Boiling point 134 to 135° C./30 Pa
The nature was a white solid.

(1-2) Synthesis of $F(CF_2)_8(C_6H_4)_2CH_2CH=CH_2$ [8F2PA]

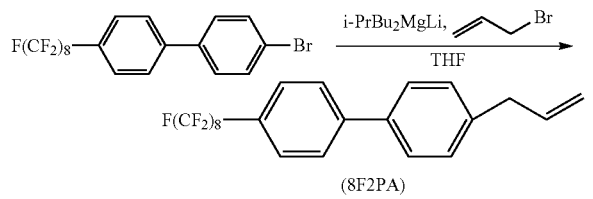

(8F2PA)

A 200-ml eggplant-shaped flask equipped with a dropping funnel was replaced with a nitrogen atmosphere and the flask was cooled with a dry ice/methanol coolant (−78° C.). Subsequently, 6.79 ml (18.1 mmol) of a 2.66 M n-butyllithium/hexane solution was added to the flask, and then 11.9 ml (9.04 mmol) of a 0.76 M isopropylmagnesium bromide/THF solution was added thereto. The mixture was stirred for one hour. Thereafter, 4.80 g (7.40 mmol) of 8F2PB dissolved in 50 ml of diethyl ether was slowly added dropwise to the flask, and the resulting mixture was stirred for one hour at −78° C.

0.42 g (22.2 mmol) of catalyst CuI was added to the solution which had changed to a yellow brown color, and then 3.82 ml (45.18 mmol) of allyl bromide was added dropwise to the flask. The mixture was stirred for 2 hours, subsequently a saturated aqueous solution of $NH_4Cl$ was added to the mixture until no precipitate was generated, and the reaction was stopped. The reaction liquid was extracted with ethyl acetate and then dehydrated over magnesium sulfate, and ethyl acetate was removed under reduced pressure. The residue was purified by distillation under reduced pressure, and thus a distillate was obtained.

The distillate thus obtained was analyzed respectively by $^1$H-NMR, FT-IR and mass spectrometry. The obtained distillate was identified as 8F2PA by $^1$H-NMR, FT-IR and mass spectrometry (m/z 612), respectively.

Yield amount 1.86 g (3.04 mmol)
Yield ratio 41%
Boiling point 164 to 167° C./80 Pa
The nature was a white solid.

(1-3) Synthesis of $F(CF_2)_8(C_6H_4)_2CH_2CH_2CH_2Si(OCH_3)_3$ [8F2P3S3M]

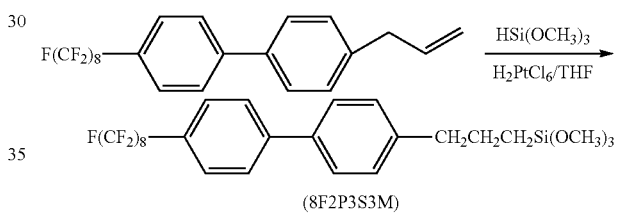

(8F2P3S3M)

A 200-ml eggplant-shaped flask equipped with a reflux condenser was replaced with a nitrogen atmosphere, and 10 ml of THF, 1.86 g (3.04 mmol) of 8F2PA, 0.77 g (6.08 mmol) of trimethoxysilane, and 0.1 ml (0.01 mmol) of a 0.1 M $H_2PtCl_6$/THF solution as a catalyst were collected in the flask. The mixture was stirred at 50° C. for 48 hours. After leaving the contents of the flask to cool naturally, THF and trimethoxysilane were distilled off under reduced pressure. The residue was purified by distillation under reduced pressure, and thus a distillate was obtained.

The distillate thus obtained was analyzed respectively by $^1$H-NMR, FT-IR and mass spectrometry. The obtained distillate was identified as 8F2P3S3M by $^1$H-NMR, FT-IR and mass spectrometry, respectively.

Yield amount 1.50 g (2.04 mmol)
Yield ratio 67%
Boiling point 160 to 165° C./30 Pa
The nature was a white solid.

(2) $F(CF_2)_{10}(C_6H_4)_2CH_2CH_2CH_2Si(OCH_3)_3$ (10F2P3S3M) was synthesized through the following steps (2-1) to (2-3).

(2-1) Synthesis of $F(CF_2)_{10}(C_6H_4)_2Br$ [10F2PB]

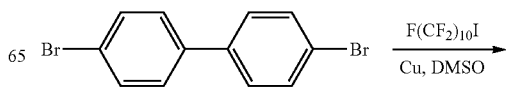

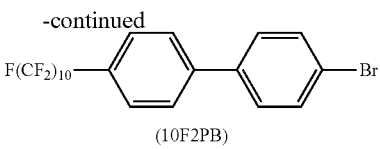

(10F2PB)

A 500-ml eggplant-shaped flask equipped with a reflux condenser and a dropping funnel was replaced with a nitrogen atmosphere, and 20.0 g (315 mmol) of copper bronze powder, 20.0 g (64.1 mmol) of 4,4'-dibromobiphenyl, and 120 ml of DMSO as a solvent were added thereto. Subsequently, the mixture was heated and stirred at 120° C. After 2 hours, 42.6 g (66 mmol) of perfluorodecyl iodide was slowly added dropwise to the flask, and then the resulting mixture was heated and stirred for 24 hours at 120° C. After completion of reflux, the solution was cooled to room temperature, and excess copper powder and a white solid were separated by filtration using a Kiriyama funnel. A mixture of the copper powder and white solid thus obtained was subjected to Soxhlet extraction using ethyl acetate. $CuBr_2$ and CuI present in the extract liquid were removed by washing with a saturated aqueous solution of NaCl, and the extract liquid was dehydrated over magnesium sulfate. Ethyl acetate was distilled off under reduced pressure. The residue was distilled under reduced pressure, and thus a distillate was obtained. The distillate thus obtained was analyzed by mass spectrometry, and as a result, the distillate was identified as 10F2PB by m/z (molecular weight) 751.

Yield amount 28.2 g (37.5 mmol)
Yield ratio 59%
Boiling point 139 to 143° C./32 Pa
The nature was a white solid.

(2-2) Synthesis of $F(CF_2)_{10}(C_6H_4)_2CH_2CH=CH_2$ [10F2PA]

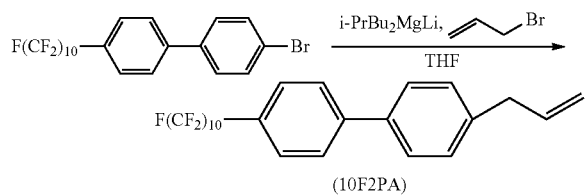

(10F2PA)

A 200-ml eggplant-shaped flask equipped with a dropping funnel was replaced with a nitrogen atmosphere, and the flask was cooled with a dry ice/methanol coolant (−78° C.). Subsequently, 7.2 ml (19.2 mmol) of a 2.66 M n-butyllithium/hexane solution was added to the flask, and then 12.3 mml (9.3 mmol) of a 0.76 M isopropylmagnesium bromide/THF solution was added thereto. The mixture was stirred for one hour. Thereafter, 5.27 g (7.40 mmol) of 10F2PB dissolved in 50 ml of diethyl ether was slowly added dropwise to the flask, and the resulting mixture was stirred for one hour at −78° C. 0.5 g (1.6 mmol) of catalyst $CuI_2$ was added to the solution which had changed to yellow brown color, and then 5.4 g (45 mmol) of allyl bromide was added dropwise to the flask. The mixture was stirred for 2 hours, subsequently a saturated aqueous solution of $NH_4Cl$ was added to the mixture until no precipitate was generated, and the reaction was stopped. The reaction liquid was extracted with ethyl acetate and then dehydrated over magnesium sulfate, and ethyl acetate was removed under reduced pressure. The residue was distilled under reduced pressure, and thus a distillate was obtained.

The distillate thus obtained was analyzed by mass spectrometry, and as a result, the distillate was identified as 10F2PA by m/z (molecular weight) 712.

Yield amount 2.16 g (3.04 mmol)
Yield ratio 41%
Boiling point 169 to 173° C./77 Pa
The nature was a white solid.

(2-3) Synthesis of $F(CF_2)_{10}(C_6H_4)_2CH_2CH_2CH_2Si(OCH_3)_3$ [10F2P3S3M]

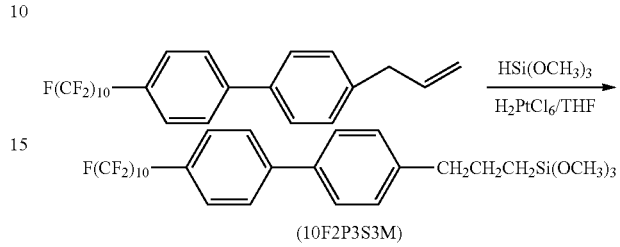

(10F2P3S3M)

A 200-ml eggplant-shaped flask equipped with a reflux condenser was replaced with a nitrogen atmosphere, and 10 ml of THF, 2.16 g (3.04 mmol) of 10F2PA, 1.0 g (8.2 mmol) of trimethoxysilane, and 0.1 ml (0.01 mmol) of a 0.1 M $H_2PtCl_6$/THF solution as a catalyst were collected in the flask. The mixture was stirred at 50° C. for 48 hours. After leaving the contents of the flask to cool naturally, THF and trimethoxysilane were distilled off under reduced pressure. The residue was distilled under reduced pressure, and thus a distillate was obtained.

Figure 4:
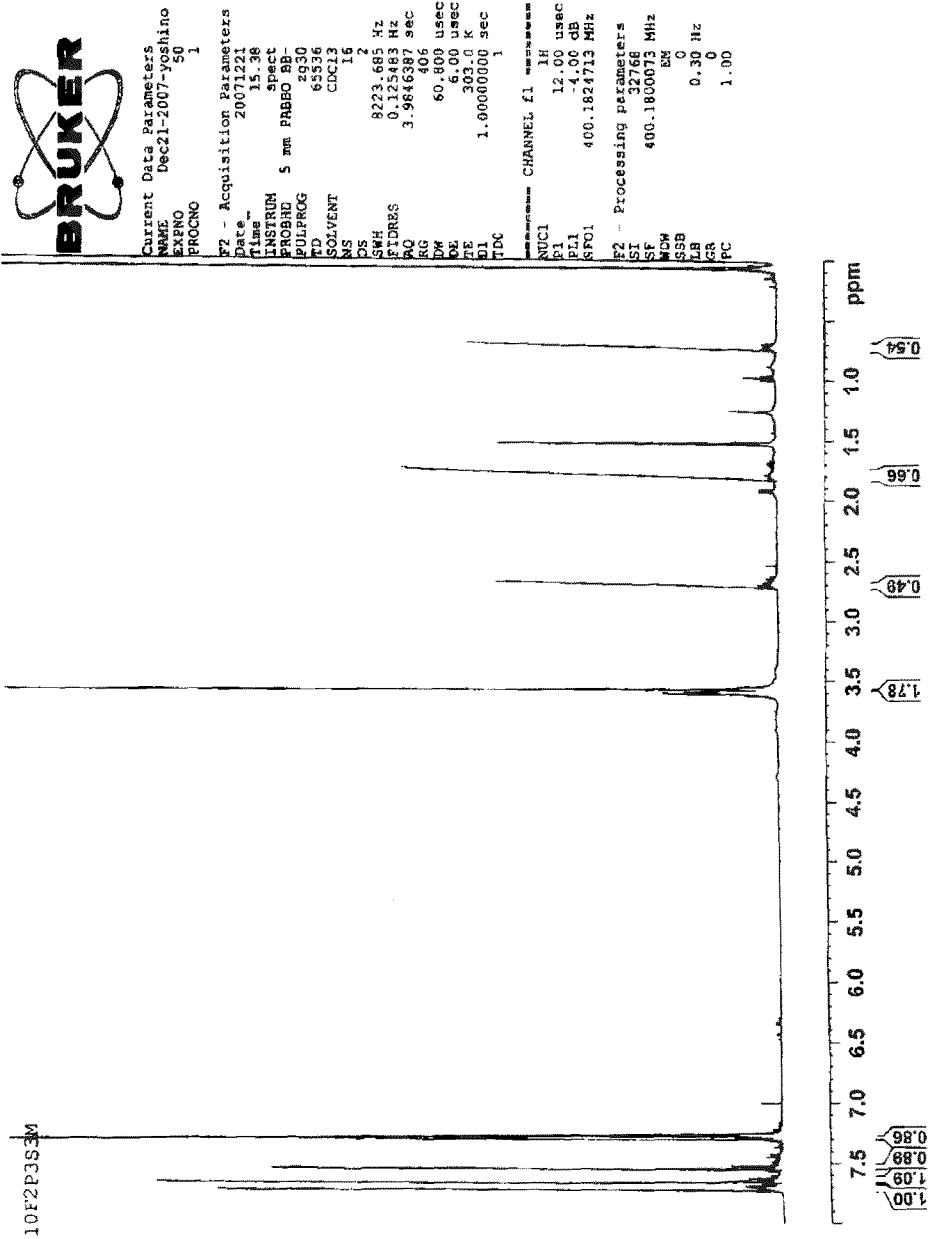
FIG. 4 is an NMR spectrum of 10F2P3S3M.
Figure 5:
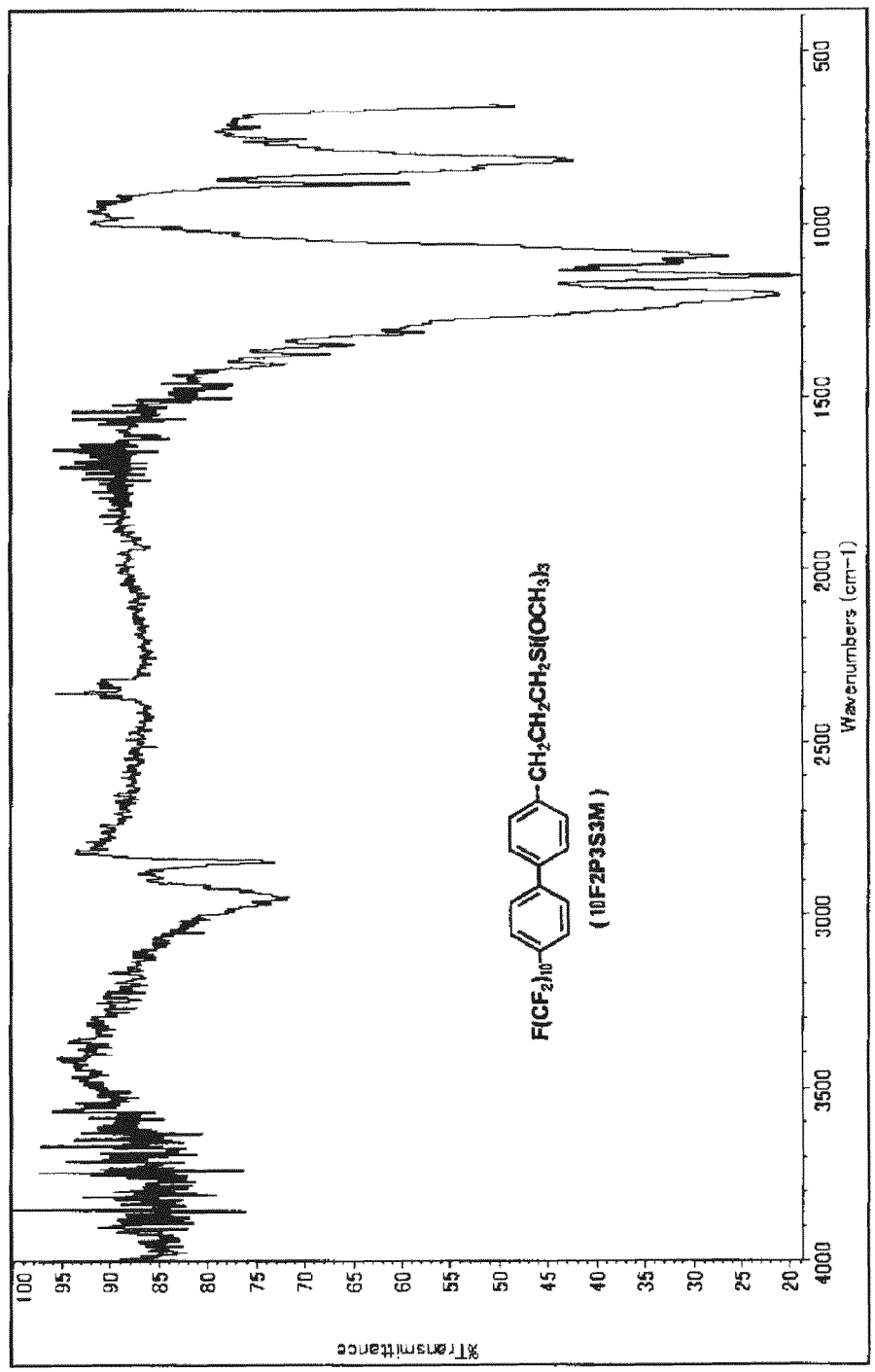
FIG. 5 is an IR spectrum of 10F2P3S3M.
Figure 6:
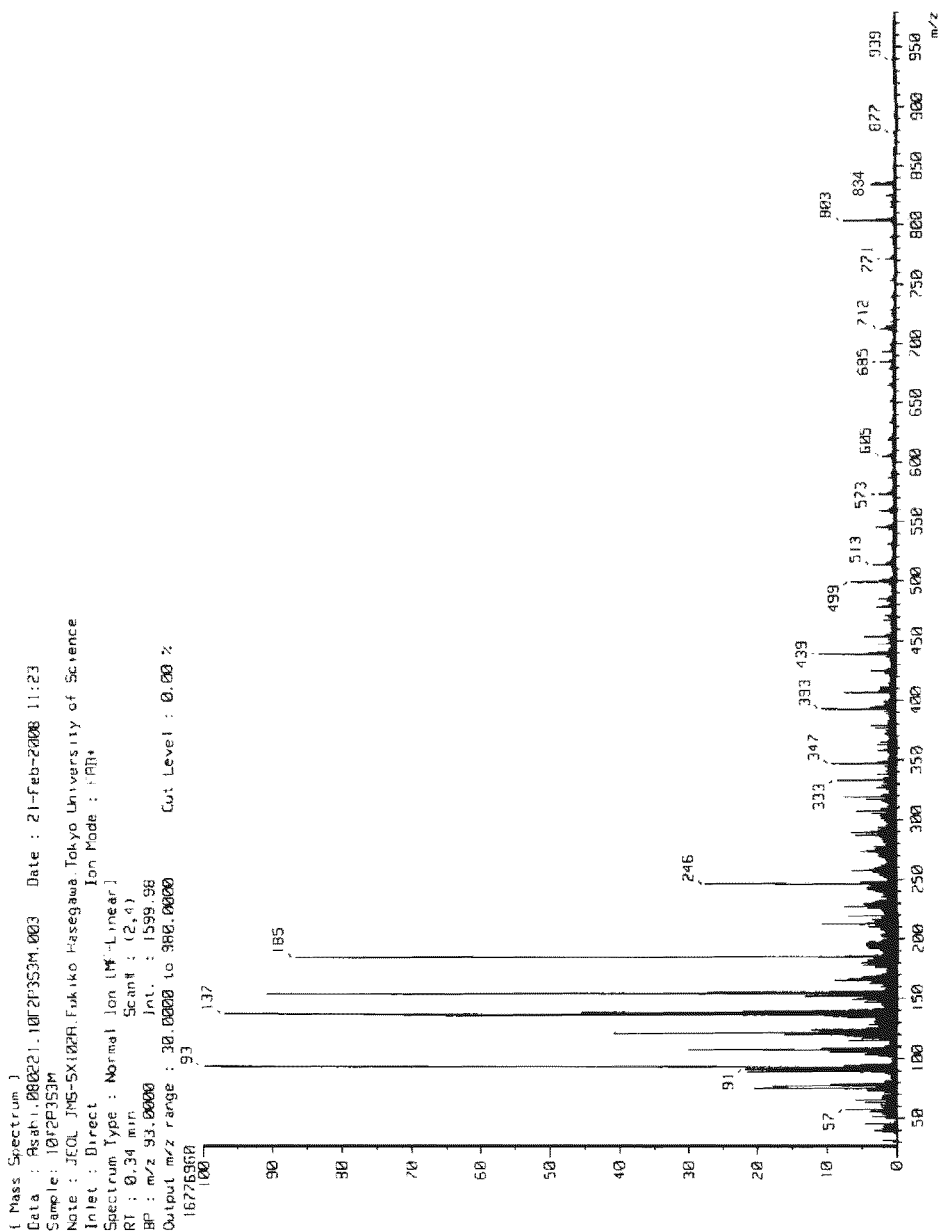
FIG. 6 is a Mass spectrum of 10F2P3S3M.

The distillate thus obtained was analyzed respectively by NMR, FT-IR and mass spectrometry. The respective spectra of FT-IR and mass spectrometry are presented in FIG. 4, FIG. 5, and FIG. 6.

As a result of the respective spectrometry analyses, the obtained distillate was identified as 10F2P3S3M. HRMS=834.1083 (calculated value: 834.5323)

Yield amount 1.65 g (1.98 mmol)
Yield ratio 65%
Boiling point 164 to 167° C./28 Pa
The nature was a white solid.

(3) Synthesis of $F(CF_2)_{12}(C_6H_4)_2CH_2CH_2CH_2Si(OCH_3)_3$ [12F2P3S3M]

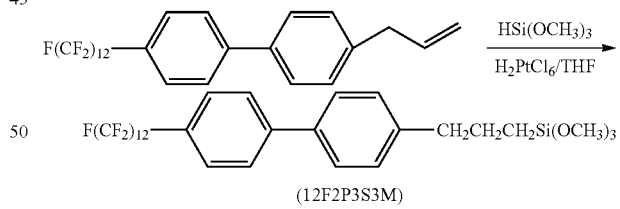

(12F2P3S3M)

A 200-ml eggplant-shaped flask equipped with a reflux condenser was replaced with a nitrogen atmosphere, and 10 ml of THF, 2.50 g (3.07 mmol) of 12F2PA, 1.0 g (8.2 mmol) of trimethoxysilane, and 0.1 ml (0.01 mmol) of a 0.1 M $H_2PtCl_6$/THF solution as a catalyst were collected in the flask. The mixture was stirred at 50° C. for 48 hours. After leaving the contents of the flask to cool naturally, THF and trimethoxysilane were distilled off under reduced pressure. The residue was distilled under reduced pressure, and thus a distillate was obtained.

The distillate thus obtained was analyzed by mass spectrometry, and as a result, the distillate was identified as 12F2P3S3M by m/z (molecular weight) 934.

Yield amount 1.96 g (2.09 mmol)
Yield ratio 65%
Boiling point 172 to 174° C./26 Pa
The nature was a white solid.

—Surface Modification of Glass—

A slide glass (S-7214, manufactured by Matsunami Glass Industry, Ltd.) was dipped in a 1 N aqueous solution of potassium hydroxide (pH>9) for 2 hours, and then the slide glass was removed and washed sufficiently with water. Thereafter, the slide glass was dried in a desiccator, and was used for the following surface modification.

Various silane coupling agents having a perfluoroalkyl chain were prepared in iso-$C_4F_9OCH_3$ (HFE-7100, manufactured by 3M, Inc.) solvent to have a concentration of 15 mmol/l. Thus, the solutions were used for the surface modification of glass.

The slide glass washed by the method described above was placed in a 200-ml wide mouth receptacle, and nitrogen replacement was carried out. To this, the modification solution prepared as described above was added to the wide mouth receptacle, and while the slide glass was completely dipped in the modification solution, the modification solution was heated to reflux for 2 hours. After cooling, the slide glass was removed and washed with a modification solvent and then with distilled water, and thus methoxy groups were converted to OH groups. Subsequently, for the purpose of subjecting the OH groups in adjacent silane coupling agent molecules to a condensation reaction, and thereby establishing a siloxane network in which siloxane bonding is formed in the form of a two-dimensional or three-dimensional network, the slide glass was subjected to a heating treatment in an oven at 150° C. for 30 minutes. After the heating treatment, the glass slide was cooled to room temperature in a desiccator, and thus a modified glass was obtained.

—Measurement of Contact Angle of Modified Glass—

The contact angle of water with respect to the modified glass was measured. The measurement of the contact angle was carried out using a liquid droplet method of dropping a water droplet of 0.9 μl on a horizontal glass plate and measuring the contact angle using a CA-X type contact angle measuring apparatus manufactured by Kyowa Interface Science Co., Ltd.

—Test on Heat Resistance of Glass Modified Using 8F2P3S3M—

For the case of using 8F2P3S3M as a silane coupling agent, the results of property tests will be presented.

A sample of modified glass was produced by the method for surface modification of glass described above.

Subsequently, this modified glass was subjected to a heating treatment in an oven at a predetermined temperature (200° C., 250° C., 300° C., 350° C., 370° C., or 400° C.) for 2 hours. After the heating treatment, the modified glass was cooled to room temperature in a desiccator, and the contact angle of water with respect to the modified glass was measured. The measurement of the contact angle was carried out by the method described above. The results are presented in Table 1.

TABLE 1

| 8F2P3S3M | |
| --- | --- |
| Temperature (° C.) | Contact angle (water) |
| 0 | 112.0 |
| 200 | 110.0 |
| 250 | 109.0 |
| 300 | 108.0 |
| 350 | 108.0 |

TABLE 1-continued

| 8F2P3S3M | |
| --- | --- |
| Temperature (° C.) | Contact angle (water) |
| 370 | 98.0 |
| 400 | 37.0 |

From these results, it is understood that the surface of the glass modified with the silane coupling agent 8F2P3S3M exhibits a high contact angle even after storage for 2 hours at a temperature of 350° C.

—Test on Durability of Glass Modified Using 8F2P3S3M—

For modified glass produced in the same manner as described above using an 8F2P3S3M solution, changes in the contact angle (water) of the modified glass surface with respect to a heat exposure time at 350° C. were investigated, and thus heat resistant durability was investigated. The results are presented in Table 2.

TABLE 2

| 8F2P3S3M | |
| --- | --- |
| Hours | Contact angle at 350° C. |
| 0 | 115.0 |
| 4 | 114.8 |
| 5 | 114.0 |
| 6 | 114.2 |
| 7 | 114.5 |
| 8 | 113.0 |

From these results, it is understood that the glass modified using a solution of the silane coupling agent 8F2P3S3M maintains a high contact angle even after storage at 350° C. for 8 hours.

—Heat Resistance with Differences in Structure of Silane Coupling Agent—

For comparison, modified glasses were produced using the respective modification solutions prepared using 8F2P3S3M, 8F2P2S3M, and 8F2S3M as silane coupling agents, and in the same manner as described above, the contact angle (water) of the modified glass surface with respect to a heat exposure time at 350° C. was measured, whereby the contact angles after lapses of various times were measured. The results are presented in Table 3.

TABLE 3

| Heat resistance with differences in structure of silane coupling agents | | | |
| --- | --- | --- | --- |
| Hours | 8F2P3S3M | 8F2P2S3M | 8F2S3M |
| 0 | 112 | 112 | 118 |
| 0.5 | 112 | 102 | 63 |
| 1.0 | 111 | 101.5 | 60 |
| 1.5 | 111 | 98 | 55 |
| 2.0 | 110 | 92 | 48 |

From these results, it is understood that the silane coupling agent 8F2P3S3M has higher heat resistance than the silane coupling agent 8F2P2S3M.

—Test on Heat Resistance of Glass Modified Using 10F2P3S3M—

For the case of using 10F2P3S3M as a silane coupling agent, the results of property tests will be presented.

A sample of modified glass was produced by the method for surface modification of glass described above.

Subsequently, this modified glass was subjected to a heating treatment in an oven at a predetermined temperature (250° C., 300° C., 350° C., 400° C., or 450° C.) for 2 hours. After the heating treatment, the modified glass was cooled to room temperature in a desiccator, and the contact angle of water with respect to the modified glass was measured. The measurement of the contact angle was carried out by the method described above. The results of comparing the present case with the case of using 8F2P3S3M are presented in Table 4.

TABLE 4

| Temperature (° C.) | 10F2P3S3M | 8F2P3S3M |
| --- | --- | --- |
| 0 | 109.0 | 112.0 |
| 250 | 105.5 | 109.0 |
| 300 | 108.3 | 108.0 |
| 350 | 108.8 | 108.0 |
| 400 | 111.4 | 37.0 |
| 450 | 80.9 | |

From these results, it is understood that the glass surface modified with the silane coupling agent 10F2P3S3M exhibits a high contact angle even after storage for 2 hours at a temperature of 400° C.

—Test on Durability of Glass Modified Using 10F2P3S3M—

For modified glass produced in the same manner as described above using a 10F2P3S3M solution, changes in the contact angle (water) of the modified glass surface with respect to a heat exposure time at 400° C. were investigated, and thus heat resistant durability was investigated. The results are presented in Table 5.

TABLE 5

| Hours | Contact angle at 400° C. |
| --- | --- |
| 0 | 109.0 |
| 2 | 111.4 |
| 4 | 107.2 |
| 6 | 107.2 |
| 8 | 112.5 |
| 10 | 110.2 |

From these results, it is understood that the glass modified using a solution of the silane coupling agent 10F2P3S3M maintains a high contact angle even after storage at 400° C. for 10 hours.

The fact that the contact angle with water is high as shown by the data given above, implies that the surface free energy is low, and that releasability and anti-fouling properties are high.

Example 1

A 0.5% solution (solvent: "HFE-7100", manufactured by Sumitomo 3M, Ltd.) of the silane coupling agent 10F2P3S3M synthesized above, was applied by spin coating on the processed surface (transfer pattern surface) of the glassy carbon substrate having a surface processed by ECR as described above, and then the glassy carbon substrate was baked for 10 minutes at 130° C. Subsequently, the transfer pattern surface was rinsed with HFE-7100. Thereby, a thin film of the silane coupling agent 10F2P3S3M was formed on the transfer pattern surface of the glassy carbon substrate.

Subsequently, a photocurable acrylic resin ("PAK-02", manufactured by Toyo Gosei Co., Ltd.) was applied by spin coating on the transfer pattern surface of the glassy carbon substrate where the thin film of the silane coupling agent was formed. Thereafter, a polyethylene terephthalate (PET) film which had been surface treated by adhering polymer resin microparticles on the surface, was affixed on the transfer pattern surface of the glassy carbon substrate, and the assembly was irradiated with ultraviolet radiation from the PET film side. Thereby, PAK-02 was cured and was also integrated with the PET film.

Subsequently, PAK-02 was detached from the glassy carbon substrate while holding the PET film.

Figure 7:
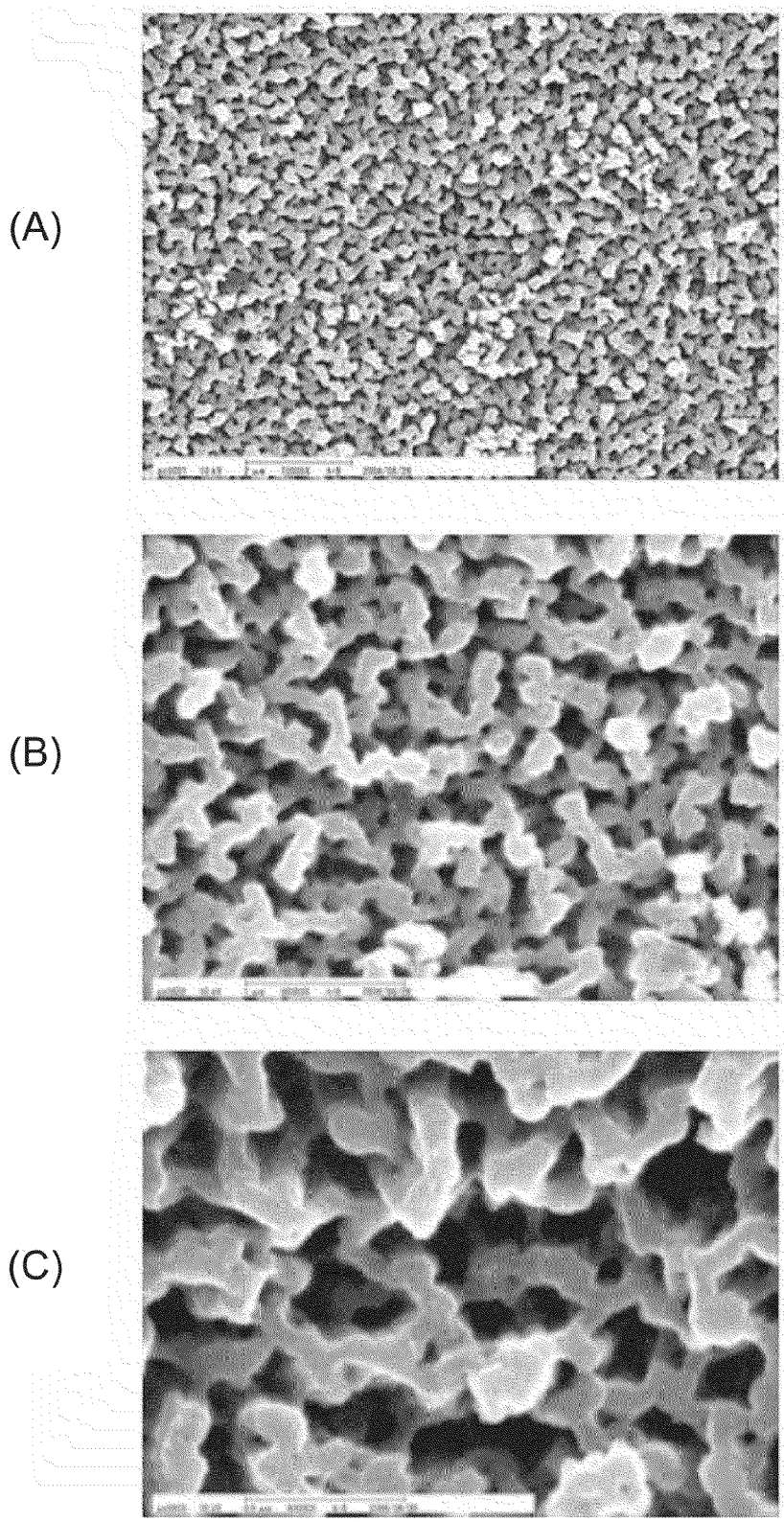
FIG. 7 is a set of SEM images obtained by observing the transfer surface of the resin in Example 1; (A) Magnification of 10,000 times, (B) Magnification of 30,000 times, and (C) Magnification of 60,000 times.
Figure 8:
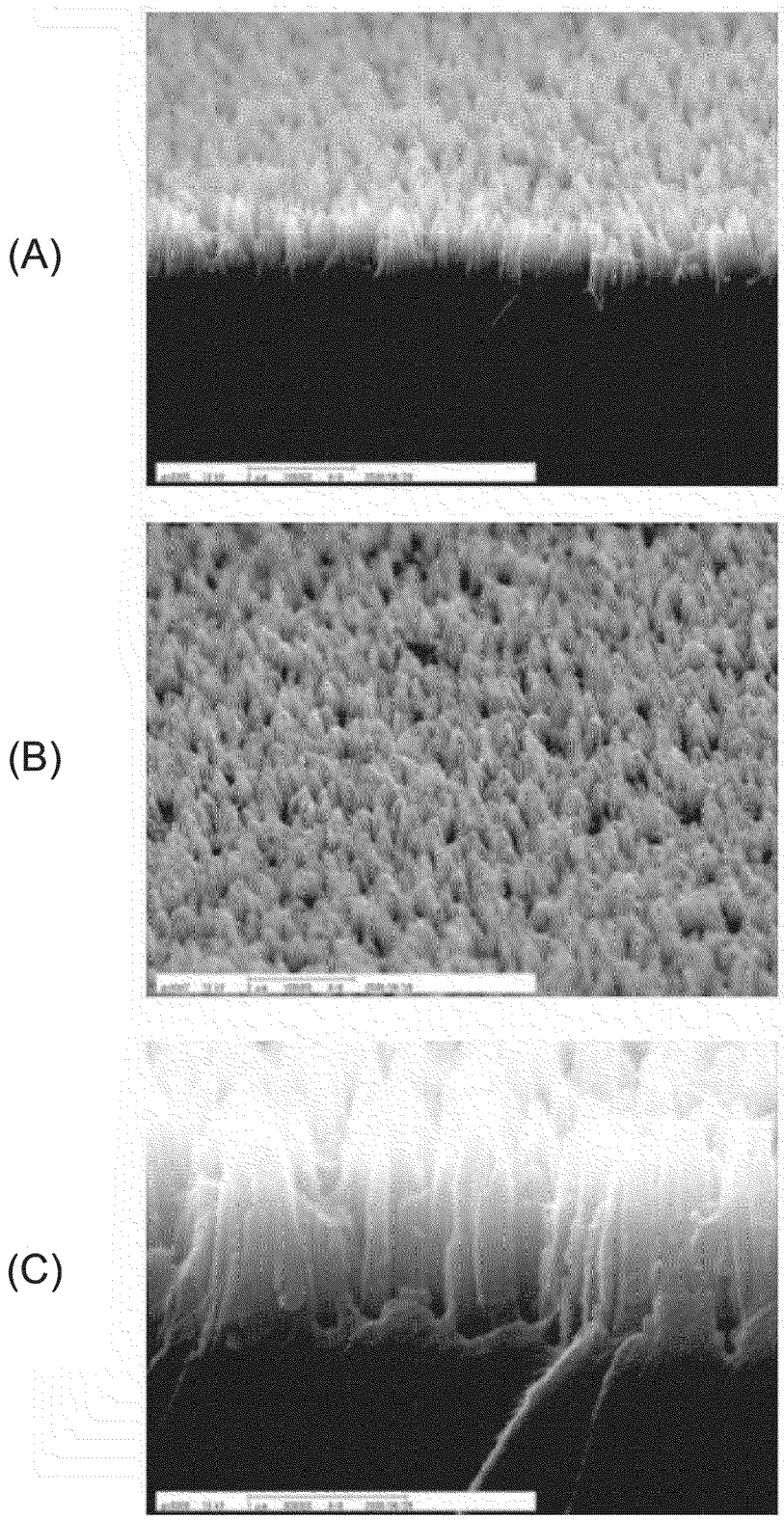
FIG. 8 is a set of SEM images obtained by observing the transfer surface of the resin in Example 1 from an oblique direction (75°); (A) Magnification of 10,000 times, (B) Magnification of 30,000 times, and (C) Magnification of 60,000 times.

The transfer surface of the resin member thus obtained was observed by SEM. FIGS. 7(A) to 7(C) are SEM images obtained by observing the transfer surface of the resin at magnifications of 10,000 times, 30,000 times, and 60,000 times, respectively, and FIGS. 8(A) to 8(C) are SEM images obtained by observing the transfer surface of the resin from an oblique direction (75°) at magnifications of 10,000 times, 30,000 times, and 60,000 times, respectively. The transfer pattern of the glassy carbon matrix has been transferred with high accuracy.

On the other hand, FIGS. 9(A) to 9(C) are SEM images obtained by observing the transfer pattern surface of the glassy carbon matrix after transfer at magnifications of 10,000 times, 30,000 times, and 60,000 times, respectively. Destruction of the needle-shaped concavo-convex pattern was not observed.

Example 2

Transfer was carried out in the same manner as in Example 1, except that pressure (185 N) was applied when the PET film was affixed to the transfer pattern surface of the glassy carbon substrate.

Figure 10:
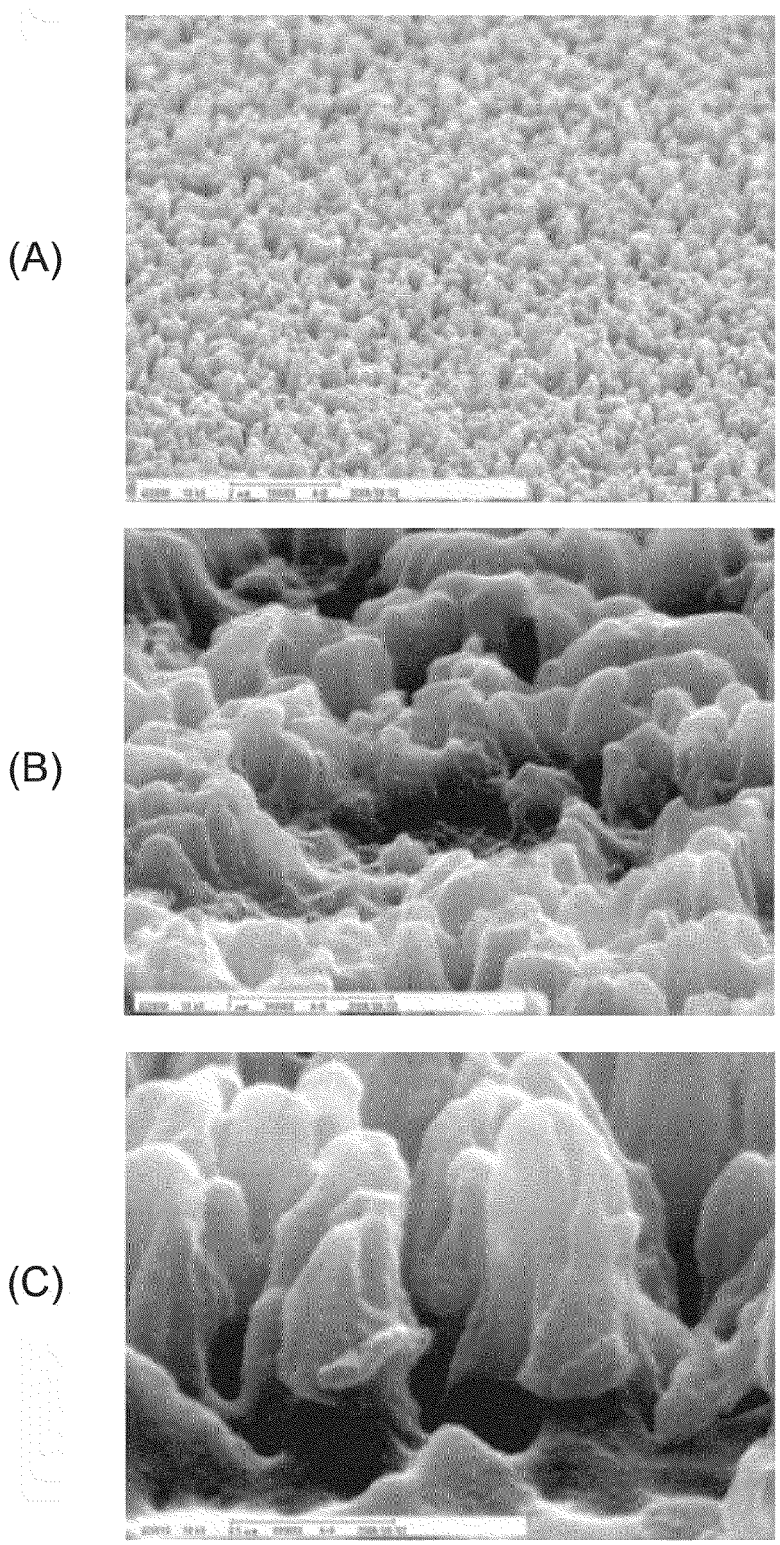
FIG. 10 is a set of SEM images obtained by observing the transfer surface of the resin in Example 2 from an oblique direction (75°); (A) Magnification of 10,000 times, (B) Magnification of 30,000 times, and (C) Magnification of 60,000 times.

FIGS. 10(A) to 10(C) are SEM images obtained by observing the transfer surface of the resin at magnifications of 10,000 times, 30,000 times, and 60,000 times, respectively. The transfer pattern of the glassy carbon matrix was transferred with high accuracy.

Furthermore, FIGS. 11(A) to 11(C) are SEM images obtained by observing the transfer pattern surface of the glassy carbon matrix after transfer at magnifications of 10,000 times, 30,000 times, and 60,000 times, respectively. Destruction of the needle-shaped concavo-convex pattern was not observed.

Example 3

A Ni substrate produced by plating (composed only of Ni; hereinafter, also referred to as plated Ni plate) was subjected to ultrasonic washing, first with acetone for about 15 minutes, and then with ethanol for 15 minutes, and the Ni substrate was subjected to ozone washing for about one hour.

The surface of this plated Ni plate was coated by dipping for about 24 hours in a 0.1% solution (solvent: "HFE-7100", manufactured by Sumitomo 3M, Ltd.) containing the silane coupling agent 8F2P3S3M synthesized as described above, and then the surface was rinsed with HFE-7100 for about one minute. Subsequently, the plated Ni plate was heated for 30 minutes at 150° C.

Subsequently, a photocurable acrylic resin ("PAK-01", manufactured by Toyo Gosei Co., Ltd.) was applied on the surface of the plated Ni plate where the silane coupling agent had been applied, and the photocurable acrylic resin was cured and then detached. This was regarded as transfer.

After the detachment (transfer) of the resin, the contact angle was measured. The contact angle was measured at three points, and the average value was calculated.

After the contact angle was measured, the plated Ni plate was rinsed with acetone, and subsequent transfers were carried out.

Also for the case of changing the heating treatment time to 80° C. for 30 minutes, and for the case of dipping the plated Ni plate in a releasing agent solution for about 60 minutes without performing a heating treatment, transfer was repeated as described above, and the contact angle was measured.

Figure 13:
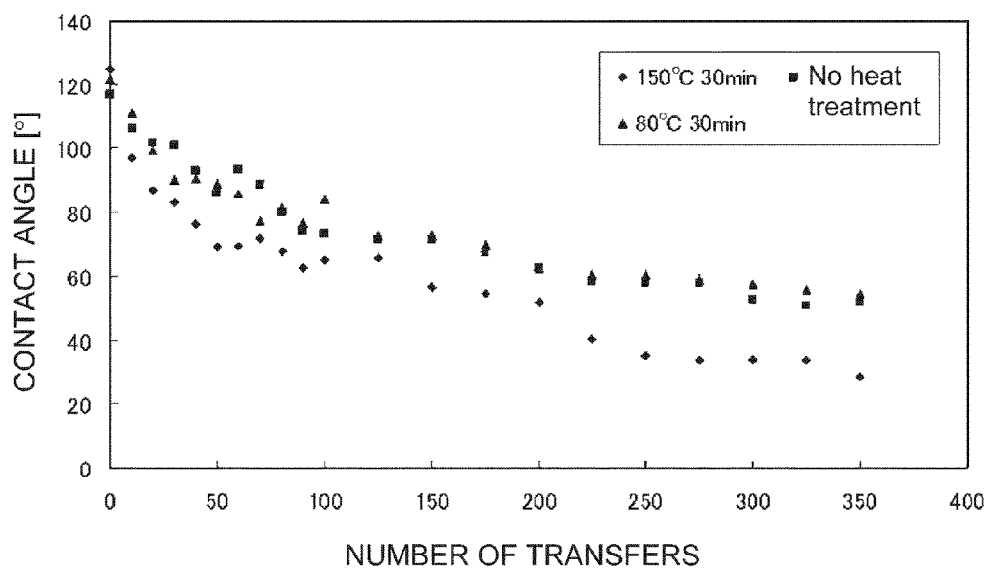
FIG. 13 is a graph showing the relationship between the number of transfers and the contact angle when the heating temperature was changed using 8F2P3S3M.

The relationship between the number of transfers and the contact angle is shown in FIG. 13. As can be seen in this diagram, when the number of transfers was increased, the contact angle decreased. However, the plated Ni plate which had been heat treated at 80° C. and the plated Ni plate which was not heat treated, had a small decrease in the contact angle as compared with the plated Ni plate which had been heat treated at 150° C., and these plated Ni plates can be said to be advantageous in the case where the transfer of the fine pattern was repeated.

Example 4

A plated Ni plate was subjected to ultrasonic washing, first with acetone for about 15 minutes, and then with ethanol for about 15 minutes, and the plated Ni plate was subjected to ozone washing for about one hour.

Subsequently, the surface of this plated Ni plate was coated, without performing a heating treatment, by dipping for 60 minutes in a 0.1% solution (solvent: "HFE-7100", manufactured by Sumitomo 3M, Ltd.) containing the silane coupling agent 10F2P3S3M synthesized as described above, and then the surface was rinsed with HFE-7100 for about one minute. Alternatively, the plated Ni plate was coated with the silane coupling agent solution, heated at 80° C. for 30 minutes, and then rinsed in the same manner. Subsequently, transfer was repeated in the same manner as in Example 3, and the contact angle was measured.

Figure 14:
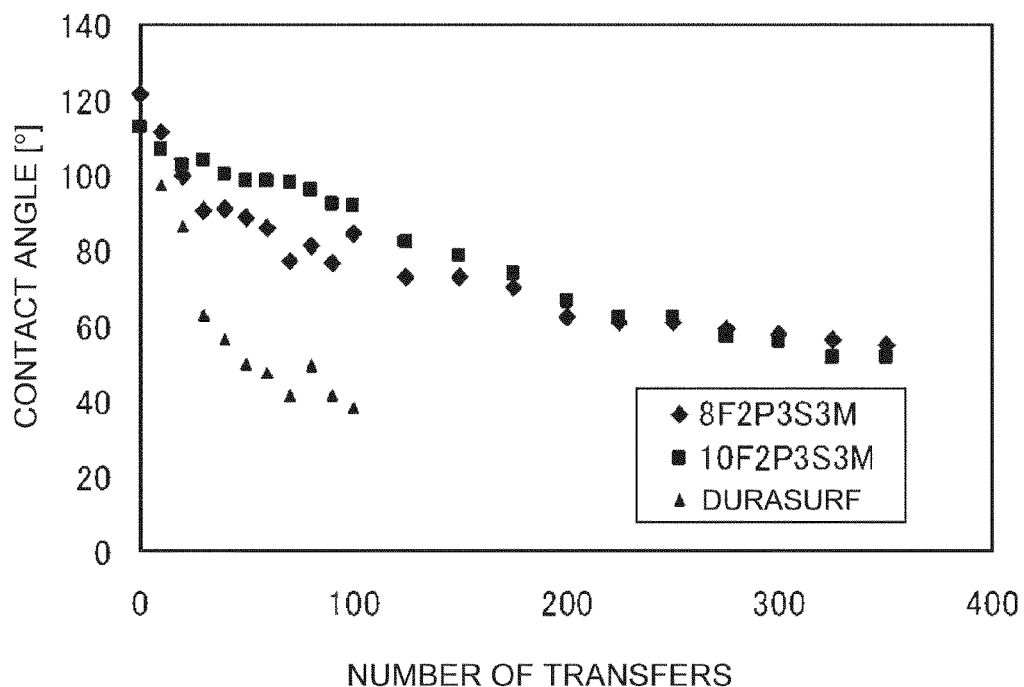
FIG. 14 is a graph showing the relationship between the number of transfers and the contact angle.

Furthermore, for the case of using 8F2P3S3M as a releasing agent, and for the case of using Durasurf 1101Z (manufactured by Harves Co., Ltd.) as a comparison, the contact angle was measured in the same manner as described above. The relationship between the number of transfers and the contact angle is shown in FIG. 14.

As can be seen from this diagram, in the case where 8F2P3S3M was used and the case where 10F2P3S3M was used, the decrease in the contact angle was small as compared with the case of using Durasurf, and these can be said to be advantageous in the transfer of fine patterns. Particularly, when 10F2P3S3M was used, the decrease of the contact angle was smaller than the case of using 8F2P3S3M until the number of transfers reached about 200 times, and it can be said to be advantageous in the transfer of fine patterns.

On the other hand, in the case of Durasurf, the contact angle was generally smaller as compared with the case of using 8F2P3S3M or 10F2P3S3M, and the contact angle which was initially 100° or greater, decreased to less than 50° after the number of transfers reached about 50 times. In this case, the occurrence of resin attachment was confirmed.

Example 5

The surface of a glassy carbon substrate (GC substrate) was subjected to fine processing under the following conditions, using an apparatus having the configuration shown in FIG. 2.

Figure 15:
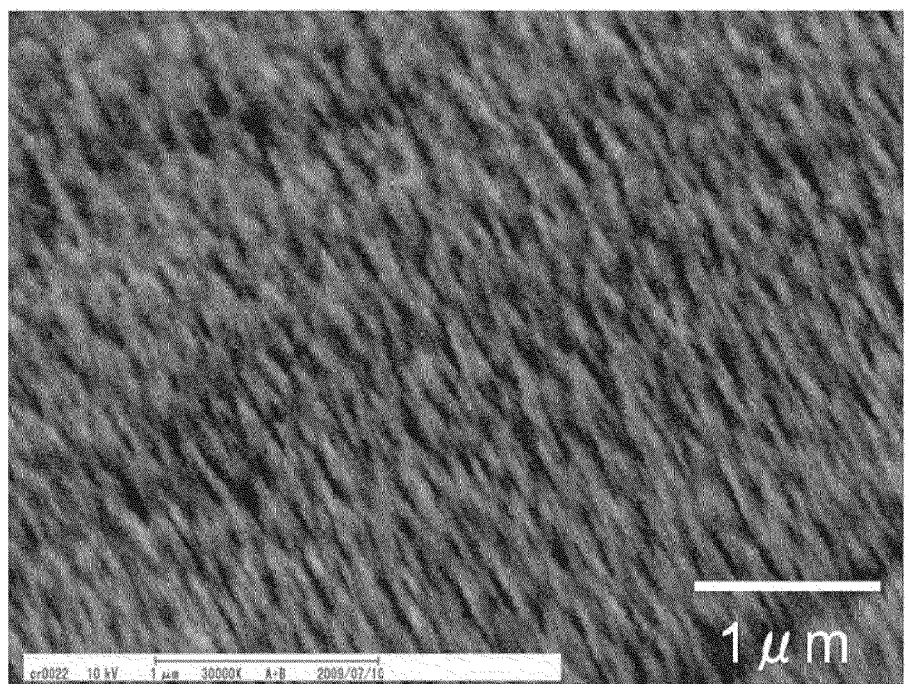
FIG. 15 is a SEM image showing the finely processed surface of a glassy carbon substrate.

Beam irradiation angle: Perpendicular to the processed surface (90° with respect to the transfer pattern surface of the substrate)
Reaction gas: Oxygen
Gas flow rate: 3.0 SCCM
Microwave: 100 W
Accelerating voltage: 500 V
Time: 20 minutes
Degree of vacuum: $1.3 \times 10^{-2}$ Pa This fine processed surface is shown in FIG. 15. A fine structure composed of a group of cone-shaped fine protrusions (pitch 53 nm, height 430 nm) was formed.

Thereafter, the fine processed surface was subjected to a liquid treatment for about 24 hours using a 0.1% solution (solvent: "HFE-7100", manufactured by Sumitomo 3M, Ltd.) containing the silane coupling agent 8F2P3S3M synthesized as described above, and then the surface was rinsed with HFE-7100. Subsequently, the fine processed surface was heated for about 30 minutes at 100° C.

Figure 16:
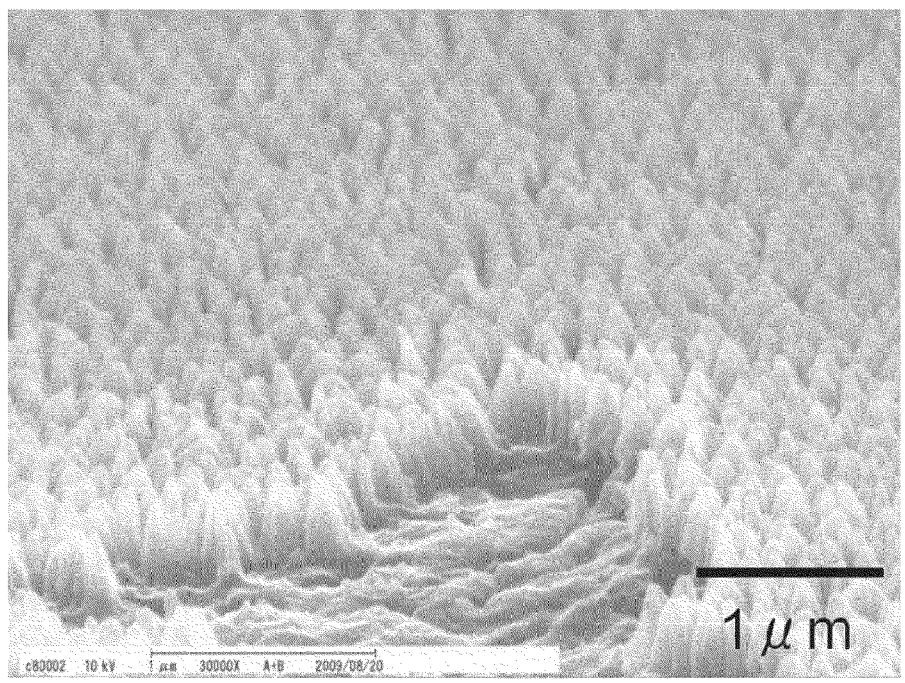
FIG. 16 is a SEM image showing the fine pattern transferred to a photocurable resin.

Subsequently, a photocurable acrylic resin ("PAK-01", manufactured by Toyo Gosei Co., Ltd.) was applied on the surface where the silane coupling agent 8F2P3S3M had been applied, the surface was irradiated with ultraviolet radiation under the conditions of 5 J/cm$^2$ and cured and then this acrylic resin was detached. FIG. 16 shows the transfer surface of the detached PAK-01. The concavo-convex pattern (pitch 110 nm, height 420 nm) of the fine processed surface of the GC substrate has been transferred to the PAK-01.

Example 6

A mold having a concavo-convex pattern having a height of 180 nm and a space width of 270 nm formed on a Si substrate by SOG (ACUGLASS 512B, manufactured by Honeywell International, Inc.), was produced under the following conditions.

EB exposure conditions
Accelerating voltage: 10 kV
Beam current: 10 pA
Dose: 800 μC/cm$^2$
Development conditions
Developer liquid: BHF
Development time: 1 minute This mold having a concavo-convex pattern was subjected to a liquid treatment for 24 hours with a 0.1% solution (solvent: "HFE-7100", manufactured by Sumitomo 3M, Ltd.) containing the silane coupling agent 8F2P3S3M, subsequently the mold was rinsed for one minute with hydrofluoroether (HFE-7100, manufactured by Sumitomo 3M, Ltd.), and then the mold was heated for 30 minutes at 100° C.

Thereafter, an Au film having a thickness of 330 mm was formed on the heat treated silane coupling agent layer, by vacuum deposition using an apparatus of VPC-260F (manufactured by Ulvac Kiko, Inc.).

Figure 17:
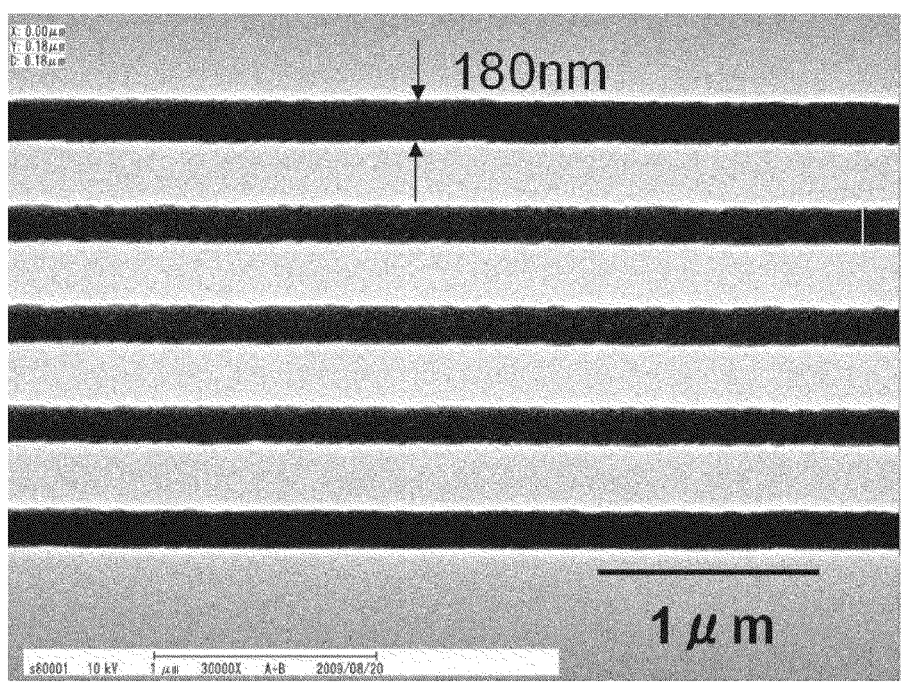
FIG. 17 is a SEM image showing the surface of an Au film formed by vacuum deposition.

This surface was observed by SEM, and as shown in FIG. 17, an Au film without any crack was formed on the surface.

Figure 18:
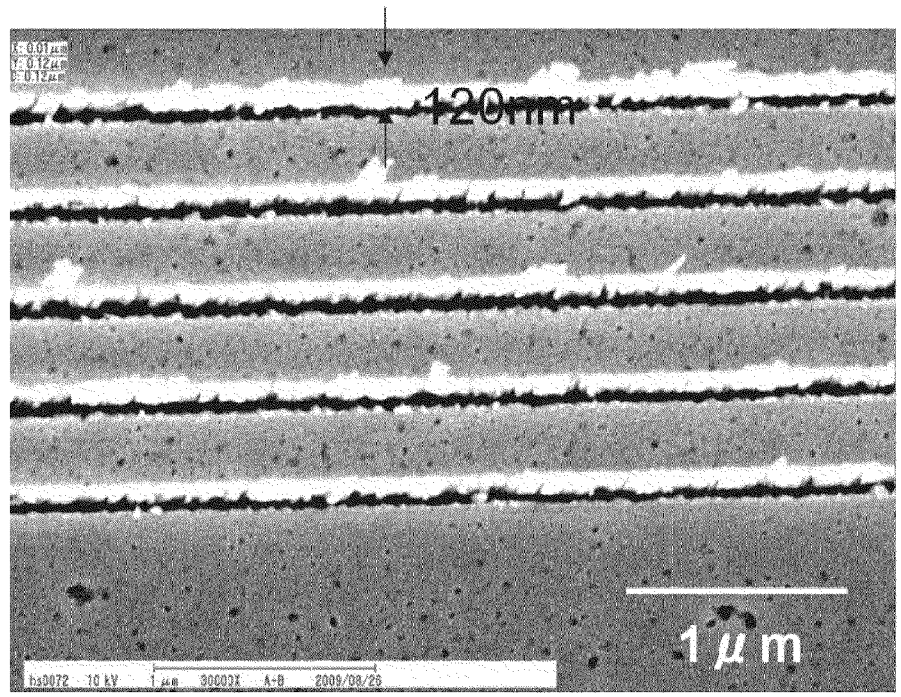
FIG. 18 is a SEM image showing the Au film transferred to a PET substrate.

Subsequently, a PET substrate was pressed against the Au film, and at the same time, the PET substrate was heated at 90° C. for 10 minutes. The PET substrate was then detached and observed by SEM. As shown in FIG. 18, an Au film on which the concavities and convexities of the mold had been reflected was transferred to the surface of the PET substrate.

Example 7

The surface of a glassy carbon substrate (GC substrate) was subjected to fine processing under the following conditions using an apparatus having the configuration shown in FIG. 2.

Figure 19:
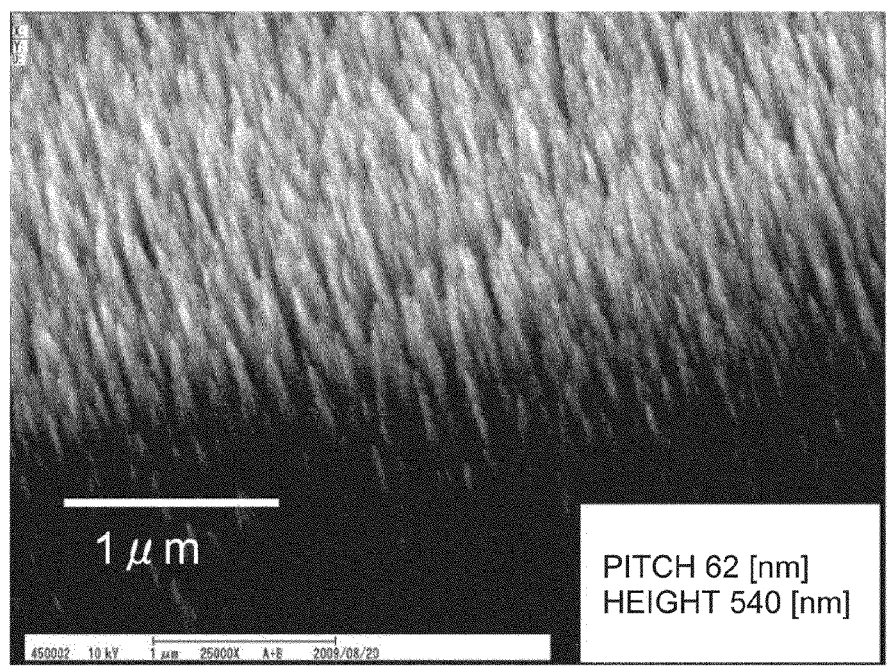
FIG. 19 is a SEM image showing the fine pattern formed on a glassy carbon substrate in Example 7.

Beam irradiation angle: Perpendicular to the processed surface (90° with respect to the transfer pattern surface of the substrate)
Reaction gas: Oxygen
Gas flow rate: 3.0 SCCM
Microwave: 100 W
Accelerating voltage: 500 V
Time: 30 minutes
Degree of vacuum: $1.3 \times 10^{-2}$ Pa This fine processed surface is shown in FIG. 19. A fine structure pattern composed of a group of cone-shaped fine protrusions (pitch 62 nm, height 540 nm) was formed.

Thereafter, a Cr film having a thickness of 30 nm was formed on this fine pattern using a vacuum deposition apparatus VPC-260F (manufactured by Ulvac Kiko, Inc.), and an Au film having a thickness of 340 nm was further formed on the Cr film.

Figure 20:
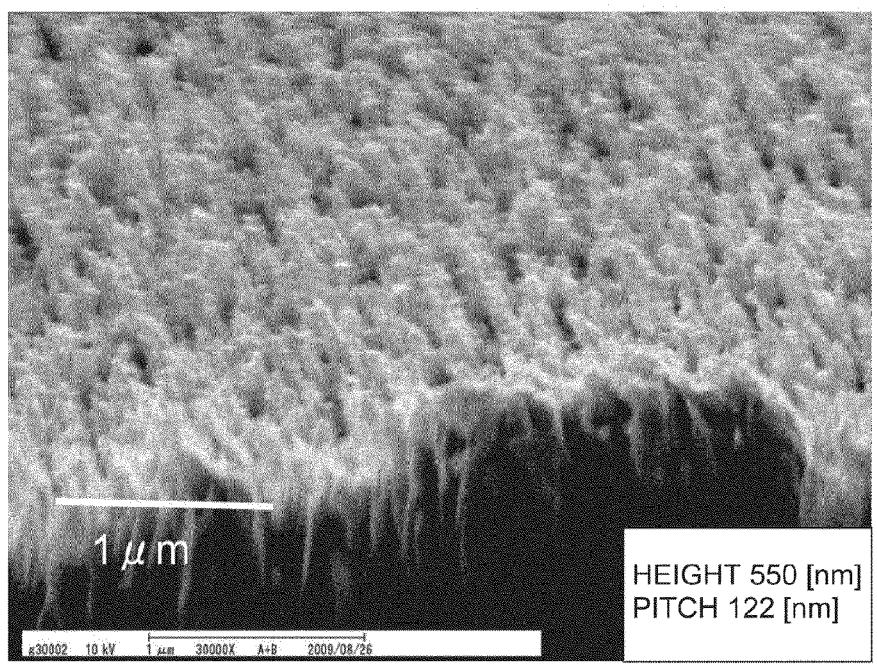
FIG. 20 is a SEM image showing the Au film transferred to the surface of the PET substrate in Example 7.

A PET substrate was pressed against the Au film, and at the same time, the PET substrate was heated at 90° C. for 30 minutes. The PET substrate was then detached and observed by SEM. As shown in FIG. 20, an Au film having a height of 550 nm and a pitch of 122 nm, on which the concavities and convexities of the mold had been reflected, was transferred to the surface of the PET substrate.

Thereafter, the PET substrate having the Au film with the concavities and convexities of the mold reflected thereon was used as a mold, and this mold was subjected to a liquid treatment for 24 hours with a 0.1% solution (solvent: "HFE-7100", manufactured by Sumitomo 3M, Ltd.) containing the silane coupling agent of 8F2P3S3M. Subsequently, the mold was subjected to a rinsing treatment and a heating treatment in the same manner as in Example 6.

Figure 21:
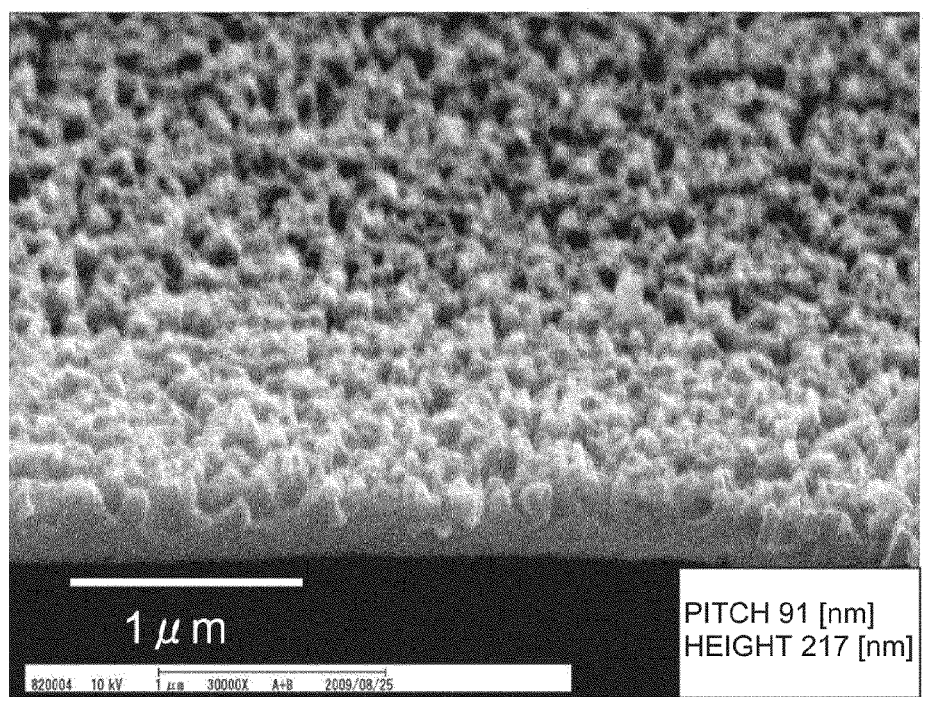
FIG. 21 is a SEM image showing the resin layer to which the pattern of the Au film of FIG. 20 has been retransferred in Example 7.

A photocurable resin (PAK-01, manufactured by Toyo Gosei Co., Ltd.) was then applied on the heat treated silane coupling agent layer, the resin was irradiated with ultraviolet radiation under the conditions of 5 J/cm² to cure the resin, and then this resin layer was detached. As shown in FIG. 21, the pattern thus transferred and formed had reflected shapes of the concavities and convexities of the mold initially formed on the glassy carbon substrate, and the pattern had a height of 217 nm and a pitch of 91 nm.

Comparative Example

Figure 22:
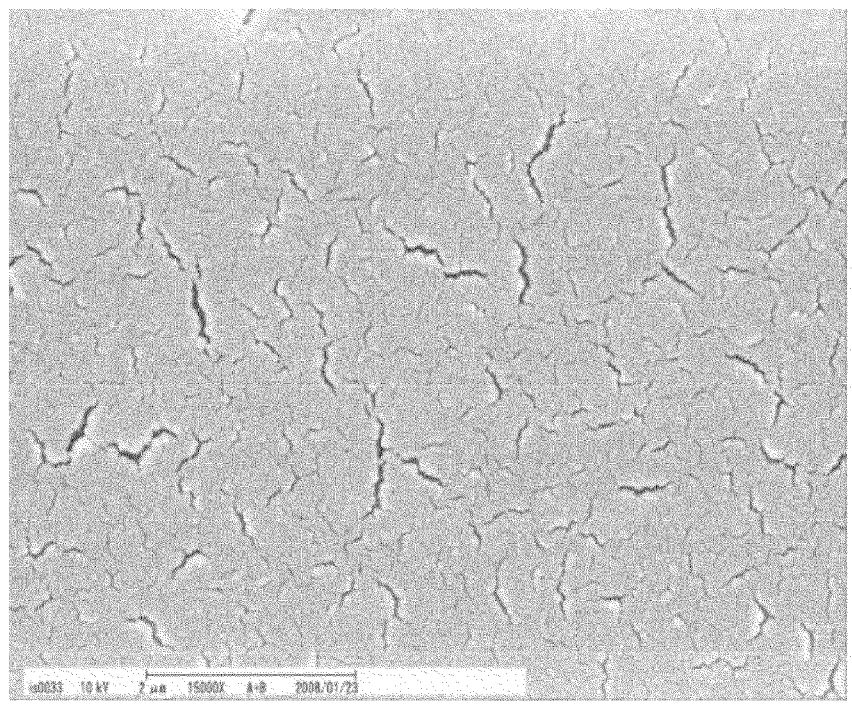
FIG. 22 is a SEM image showing the surface of the Au film formed by vacuum deposition in Comparative Example.

An Au film was formed by vacuum deposition using Optool as a releasing agent, and as shown in FIG. 22, many cracks were formed on the surface of the Au film. It is speculated that cracks entered into the releasing agent due to the heat at the time of deposition, and thus cracks occurred in the Au film as well.

Example 8

The surface of a glassy carbon substrate (10 mm square) was subjected to fine processing under the following conditions using an apparatus having the configuration shown in FIG. 2.
Accelerating voltage: 500 [V]
Processing time: 60 [min]
Gas species: $O_2$
Gas flow rate: 3.00 [SCCM]

Figure 23:
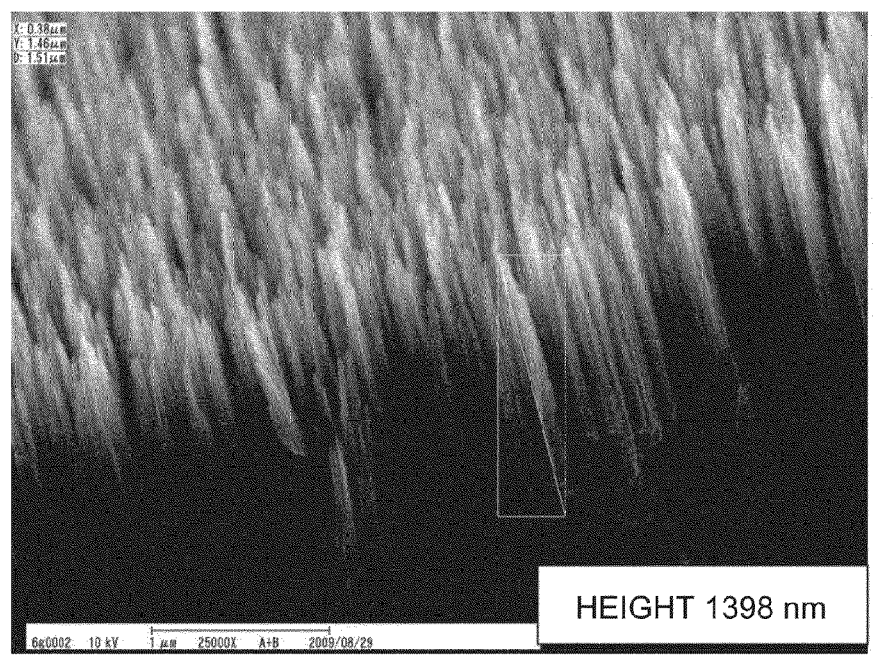
FIG. 23 is a SEM image showing the processed surface of a GC substrate in Example 8.
Figure 24:
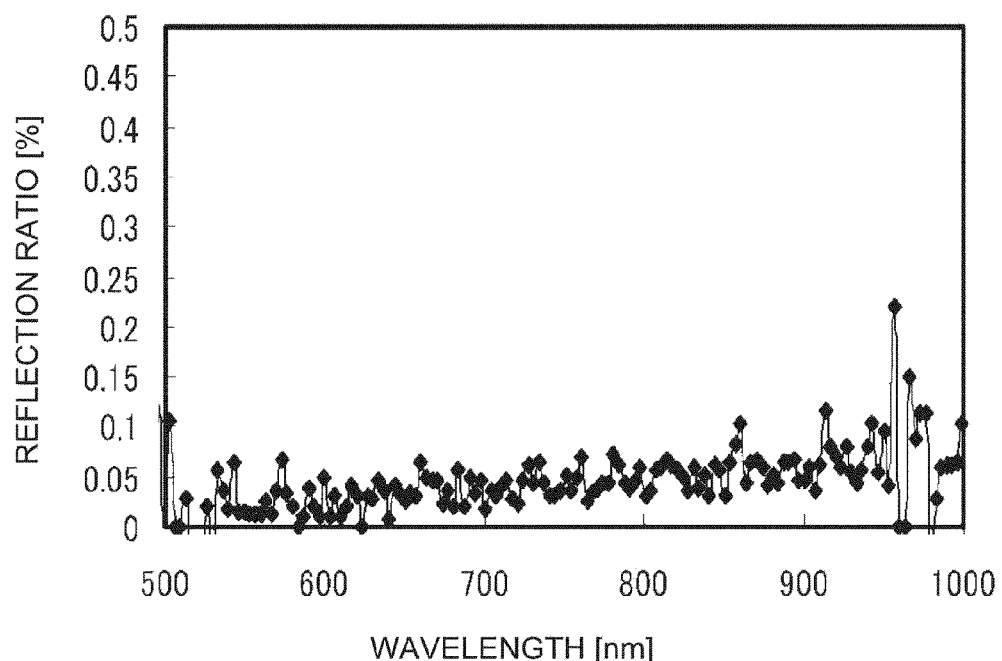
FIG. 24 is a diagram showing the reflection ratio of the GC substrate in Example 8.

A SEM image of the processed surface of the GC substrate after processing is shown in FIG. 23, and the reflection ratio is presented in FIG. 24. The fine protrusions of the fine pattern formed on the processed surface had a height of 1398 nm and a pitch of 84 nm.

Figure 25:
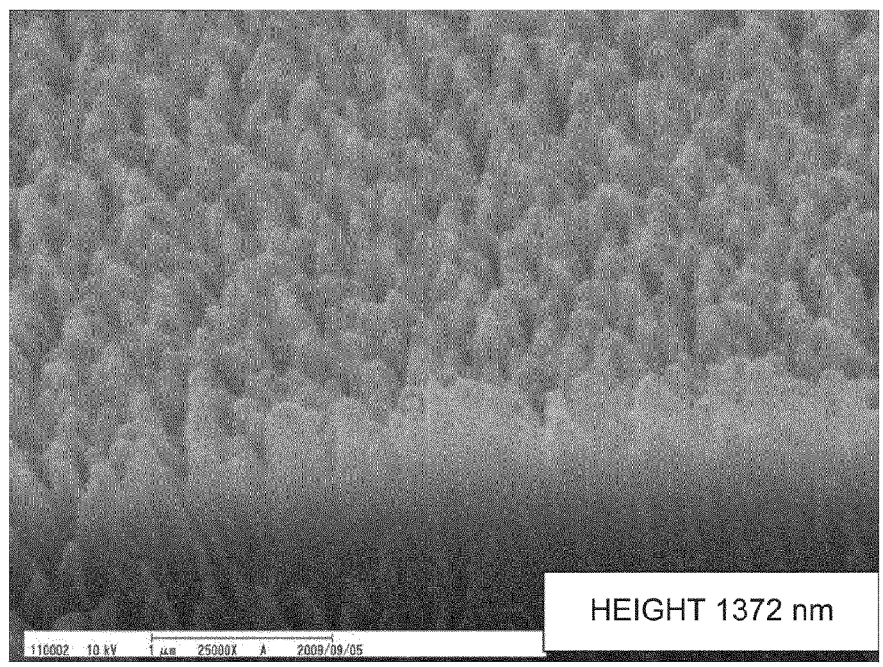
FIG. 25 is a SEM image showing the resin layer transferred to a PET film.

The GC substrate after processing was dipped for one hour in a 0.1% solution (solvent: "HFE-7100", manufactured by Sumitomo 3M, Ltd.) containing the silane coupling agent 8F2P3S3M, and then a photocurable resin (PAK-02, manufactured by Toyo Gosei Co., Ltd.) was applied on the fine pattern. A PET film was further pressed thereon, and UV irradiation (5 J/cm²) was performed from the PET film side, to cure the resin. After curing, the PET film was detached, and the PAK-02 resin layer reflecting the fine pattern of the GC substrate was transferred to the PET film side. FIG. 25 shows the resin layer transferred to the PET film. The resin layer had a fine pattern having a height of about 1372 nm and a pitch of about 123 nm formed thereon.

Figure 26:
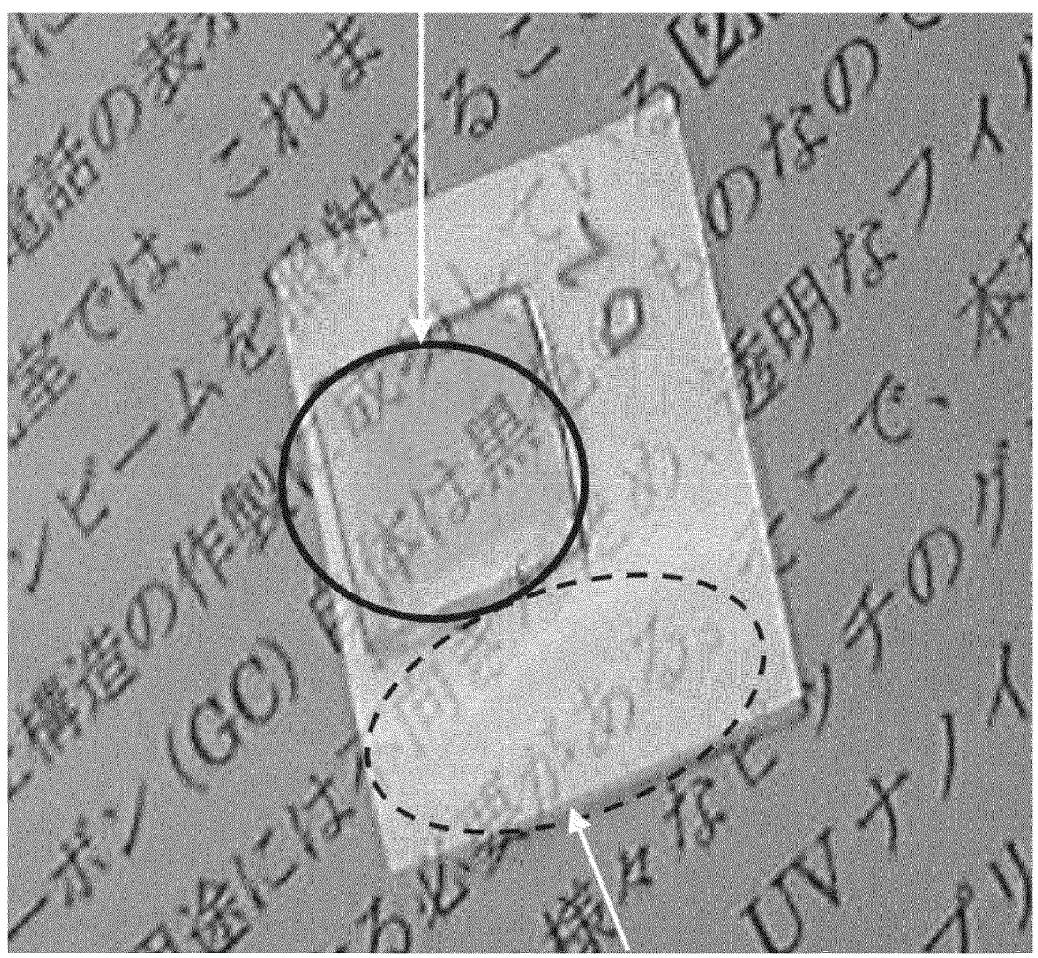
FIG. 26 is a picture obtained by observing characters through a PET film to which a resin layer has been transferred.

Characters were observed through the PET film to which the resin layer was transferred, and as shown in FIG. 26, the characters were more easily seen at the sites where the resin layer was transferred, as compared with the sites where the resin layer was not transferred. It is thought that as the fine pattern of the GC substrate was reflected on the PET film, a reflection preventing effect could be obtained.

As described above, the reflection preventive structure and the like according to the invention have been described, but the invention is not limited to the exemplary embodiments and Examples described above. For example, in the case of producing a matrix according to the invention using a glassy carbon substrate, the apparatus is not limited to the ECR type ion beam processing apparatus such as shown in FIG. 2, and other processing apparatuses such as an ICP may also be used.

The invention claimed is:

1. A method for producing a transfer structure, the method comprising:
   a step of forming a film of a silane coupling agent having a biphenylalkyl chain represented by the following formula (I), on a surface of a matrix having a transfer pattern formed on the surface thereof;

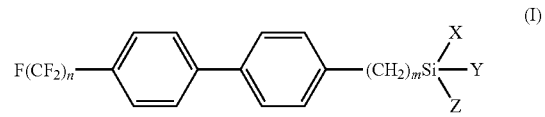

wherein, in formula (I), n represents an integer of 8, 10, 12 or 14; m represents 3; and X, Y and Z each independently represent a hydrolyzable group that is a methoxy group, an ethoxy group, a propoxy group, an isopropoxy group, or a halogen atom;
   a step of applying a transfer-receiving material on the surface of the matrix having the film of the silane coupling agent formed thereon, thereby transferring the pattern on the surface of the matrix; and
   a step of detaching the transfer-receiving material from the matrix to obtain a transfer structure formed of the transfer-receiving material.

2. The method for producing a transfer structure according to claim 1, wherein in formula (I), n is 10, 12 or 14.

3. The method for producing a transfer structure according to claim 1, wherein in formula (I), X, Y and Z are all identical.

4. The method for producing a transfer structure according to claim 1, wherein in formula (I), X, Y and Z are all methoxy groups.

5. The method for producing a transfer structure according to claim 1, further comprising a step of preparing the matrix having the transfer pattern formed on the surface thereof, as a preceding step of the step of forming the film of the silane coupling agent.

6. The method for producing a transfer structure according to claim 1, wherein in the step of forming the film of the silane coupling agent, a liquid containing the silane coupling agent is applied on the surface of the matrix having the transfer pattern formed thereon to form a layer containing the silane coupling agent on the surface of the matrix, a heating treatment is subsequently carried out, and before or after the heating treatment, the layer containing the silane coupling agent is rinsed.

7. The method for producing a transfer structure according to claim 1, wherein the transfer pattern formed on the surface of the matrix is a pattern containing a group of fine protrusions each having a height of less than 1 μm and an aspect ratio of 2 or greater.

8. The method for producing a transfer structure according to claim 1, wherein the matrix is formed from a base material of glassy carbon, and the transfer pattern, which includes a group of fine protrusions each having a shape that tapers toward a tip thereof, is formed on the surface of the base material.

9. A matrix having a transfer pattern formed on a surface thereof, and having a film of a silane coupling agent having a biphenylalkyl chain represented by the following formula (I), formed on the surface where the transfer pattern is formed:

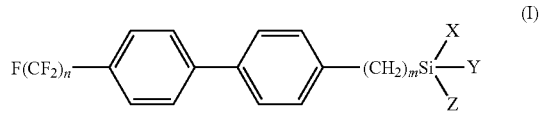

wherein n represents an integer of 8, 10, 12 or 14; m represents 3; and X, Y and Z each independently represent a hydrolyzable group that is a methoxy group, an ethoxy group, a propoxy group, an isopropoxy group or a halogen atom.

10. The matrix according to claim 9, wherein in formula (I), X, Y and Z are all methoxy groups.

11. The matrix according to claim 9, wherein the transfer pattern formed on the surface of the matrix is a pattern containing a group of fine protrusions each having a height of less than 1 μm and an aspect ratio of 2 or greater.

* * * * *